United States Patent [19]

Knapp et al.

[11] Patent Number: 5,499,192

[45] Date of Patent: Mar. 12, 1996

[54] METHOD FOR GENERATING LOGIC MODULES FROM A HIGH LEVEL BLOCK DIAGRAM

[75] Inventors: Steven K. Knapp, Santa Clara; Jorge P. Seidel, San Jose; Steven H. Kelem, Los Altos Hills, all of Calif.

[73] Assignee: XILINX, Inc., San Jose, Calif.

[21] Appl. No.: 268,884

[22] Filed: Jun. 30, 1994

Related U.S. Application Data

[63] Continuation of Ser. No. 785,659, Oct. 30, 1991, abandoned.

[51] Int. Cl.⁶ ................................................. G06F 15/60
[52] U.S. Cl. ........................ 364/489; 364/490; 364/578
[58] Field of Search ................................. 364/488, 489, 364/490, 491, 492, 493, 578

[56] References Cited

U.S. PATENT DOCUMENTS

| | | | |
|---|---|---|---|
| 4,150,331 | 4/1979 | Lacher | 324/73 PC |
| 4,488,354 | 12/1984 | Chan et al. | 29/830 |
| 4,527,249 | 7/1985 | Van Brunt | 364/578 |
| 4,694,411 | 9/1987 | Burrows | 364/578 |
| 4,725,970 | 2/1988 | Burrows et al. | 364/578 |
| 4,739,505 | 4/1988 | Leslie | 371/37 |
| 4,816,999 | 3/1989 | Berman et al. | 364/489 |
| 4,831,543 | 5/1989 | Mastellone | 364/489 |
| 4,872,126 | 10/1989 | Premerlani et al. | 364/578 |
| 4,942,536 | 7/1990 | Watanabe et al. | 364/490 |
| 4,964,056 | 10/1990 | Bekki et al. | 364/488 |
| 4,989,256 | 1/1991 | Buckley | 382/15 |
| 5,031,111 | 7/1991 | Chao et al. | 364/491 |
| 5,050,091 | 9/1991 | Rubin | 364/488 |
| 5,084,824 | 1/1992 | Lam et al. | 364/490 |
| 5,111,413 | 5/1992 | Lazansky et al. | 364/578 |
| 5,210,701 | 5/1993 | Hana et al. | 364/491 |
| 5,267,175 | 11/1993 | Hooper | 364/489 |
| 5,272,651 | 12/1993 | Bush et al. | 364/578 |
| 5,297,066 | 3/1994 | Mayes | 364/578 |

OTHER PUBLICATIONS

*Computer Dictionary*, Microsoft Press, Redmond, Washington, 1994 pp. 164, 182.

Dutt, "Generic Component Library Characterization For High Level Synthesis", Proceedings 4th CSI/IEEE, International Symposium on VLSI Design, IEEE Compt. Soc. Press, Jan. 4–8, 1991, pp. 5–10.

*Primary Examiner*—Kevin J. Teska
*Assistant Examiner*—Stephen J. Walder, Jr.
*Attorney, Agent, or Firm*—Jeanette S. Harms; Edel M. Young

[57] ABSTRACT

A set of module generators produce optimized implementations of particular circuit logic arithmetic functions for Field Programmable Gate Arrays (FPGAs) or other digital circuits. The module generators allow a circuit designer to spend more time actually designing and less time determining device-specific implementation details. The module generators accept a high level block diagram schematic of the circuit and automatically perform the detailed circuit design, including propagation of data types (precision and type) through the circuit, and low level circuit design optimization using a library of arithmetic and logic functions. The module generators are particularly useful for designs using field programmable gate arrays because of their unique architectures and ability to implement complex functions.

16 Claims, 11 Drawing Sheets

METHOD FOR GENERATING LOGIC MODULES FROM A HIGH LEVEL BLOCK DIAGRAM

This application is a continuation of application Ser. No. 07/785,659, filed Oct. 30, 1991 now abandoned.

RELATED APPLICATIONS

The present invention relates to inventions described in the following copending (concurrently filed) patent applications:

1. Steven H. Kelem and Steven K. Knapp, METHOD FOR PROPAGATING DATA TYPE IN A HIGH LEVEL CIRCUIT DESIGN, U.S. patent application Ser. No. 07/785,664 now U.S. Pat. No. 5,422,833.
2. Jorge P. Seidel and Steven K. Knapp, METHOD FOR OPTIMIZING RESOURCE ALLOCATION STARTING FROM A HIGH LEVEL CIRCUIT DESIGN, U.S. patent application Ser. No. 07/784,842.
3. Jorge P. Seidel and Arun K. Mandhania, METHOD FOR IMPLEMENTING SET/RESET SYNCHRONOUSLY OR ASYNCHRONOUSLY IN A PROGRAMMABLE LOGIC DEVICE. U.S. patent application Ser. No. 07/787,343 now U.S. Pat. No. 5,337,255.

The above disclosures are incorporated herein by reference.

BACKGROUND OF THE INVENTION

Field of the Invention

The invention relates to computer aided digital circuit design, and in particular to methods for capturing a design and implementing that design using high level circuit elements, such as arithmetic and logical components.

DESCRIPTION OF THE PRIOR ART

Computer Aided Circuit Design

In computer aided design, a person (designer) usually designs a logic circuit for implementing a desired function with the assistance of a schematic capture package or other means for entering the design into a computer.

In the past, users have typically described their circuits using well known Boolean functions such as AND, XOR, and clocked functions such as flip flop and latch. Users have then combined these primitive Boolean and clocked functions to implement such higher level functions as ADDER, COUNTER, REGISTER, MULTIPLEXER, RAM, for example, or used macros that were restricted to a specific width before being placed in the circuit.

Programmable Logic Architectures

Several families of programmable logic devices (integrated circuit chips) are known which a user can configure to perform a logic function selected by the user i.e., to design a logic circuit.

The earliest of these user programmable devices are called programmable logic arrays (PLA). These devices provide an array of AND gates and an array of OR gates. Means are provided for connecting any combination of outputs of the AND gates to each of the OR gate inputs. Outputs of the OR gates can be connected to output pins of the chip to provide the function selected by the user. Such devices can implement any two-level logic function, that is, a function of the sum-of-products form $$(A*B*C)+(A*C*D)+(B*E)+(A*C*F)+G \qquad (1)$$

where * indicates the AND function and + indicates the OR function.

Also available are programmable array logic (PAL) devices which are similar to PLA's and also provide feedback from outputs of the OR gates back to inputs of the AND gates, and thus allow more than two-level logic to be implemented.

Further available are field programmable gate array (FPGA) devices which provide an array of logic cells, each of which can implement any function of a limited number of variables (on the order of 3 to 9 variables), and means for interconnecting these logic cells to generate complex functions, and feeding inputs to and taking outputs from selected internal points.

Field Programmable Gate Array integrated circuit chips include architectural features aimed at implementing a user's (designer's) logic which are physically arranged in a way which will be convenient for many users. For example, logic array chips made by Xilinx, Inc. include input/output blocks and a clock buffer physically close to external pins of the chip and physically connected to one or more of the external pins. Logic blocks internal to the chip implement complex logic functions but do not include input or output buffers needed for accessing external pins.

Use of Programmable Logic Array Chips

The user typically selects a chip or chips to implement the desired logic. Different kinds of logic are most efficiently implemented in different chips. Further, the same logic is implemented differently in different chip architectures. For example, logic to be implemented by the two-level (AND followed by OR) elements of a PLA must be written in the two-level sum-of products form, which may result in repetition of some variables in several of the products, as indicated by the variable A in equation (1) above. However, in an FPGA, any combinatorial function of four or five variables can be implemented in one logic block regardless of complexity and regardless of the number of levels of logic. In any case, the logic circuit which is selected must implement the logic circuit designed by the user. The logic circuit is preferably implemented by the existing chip in a way which generates results efficiently and makes good use of the resources available in the chip. Thus the architectural features of the chip are preferably matched to the features of the logic circuit.

Inconvenience of Past Design Methods

Different logic device architectures are best able to handle logic in different forms depending upon architecture. For example, if the logic is to be implemented by a two-level PLA (programmable logic array) device (chip), the logic must be written in that form and assigned to particular AND and OR gates which will implement parts of the two-level logic. On the other hand, if the logic will be implemented in an FPGA (field programmable gate array) having logic elements each of which can implement any function of four or five variables, the logic is best specified in units having five inputs or fewer but may be multi-level. There are many ways to map the same logic into a device, and some ways are mapped into that device much more efficiently than others. It is possible manually to work out efficient ways for mapping some of the common functions into a particular device. This manual effort must be repeated each time there is another variation on that function.

This working out of an optimum implementation is tedious and time consuming for the circuit designer and also subject to error. Further, if the designer changes the design after a first implementation which was in some respect unsatisfactory, the designer must then repeat the entire design process to achieve the changes needed in the design. It has not in the past been possible for a designer to specify logic simply in terms of high level functions which are desired to be implemented, without also specifying many additional parameters which constrained the implementation.

Certain high level functions are commonly used by many circuit designers, and the most efficient ways to implement these functions in certain logic devices have been investigated.

However, the past methods have two deficiencies. The problem is, if the designer wants an eleven bit adder and macros come in 2-bit, 4-bit, 8-bit and 16-bit sizes. So he uses an 8-bit adder and a 2-bit adder and simple logic for the eleventh bit. Even if one wants to ignore carry-out, the logic for computing the carry-out will still be present in the macro. Secondly, it is not possible to program a computer to recognize all of these high level functions so as to implement them efficiently in the particular logic device selected by the designer.

It would be desirable to implement these higher level functions automatically, with greater convenience for the user, so that less time is required from when the design is conceived and specified until it is implemented in a logic device (i.e., integrated circuit).

SUMMARY OF THE INVENTION

According to the present invention, a library of high level logic and arithmetic functions and means for implementing these functions in a particular device (chip) are provided, along with symbols for these functions which are part of a digital logic circuit schematic capture package. The designer may then call a high level symbol from the library of symbols, place it into a schematic diagram, and indicate parameters of the function which are to be applied to a particular design. Alternatively, the designer may specify the high-level functions, parameters and interconnections in a textual or netlist language.

A computer program then converts the symbol and parameters provided by the designer to a circuit diagram and maps this circuit diagram to the logic elements and interconnections provided on the physical device (actual chip or circuit). In a preferred embodiment, the library includes such common arithmetic circuit elements as adder, accumulator, comparator, and register and such other logic circuit elements as Boolean functions (AND, OR, etc.) and multiplexers. In one preferred embodiment 30 modules are provided in a library. These 30 modules represent thousands of high level functions. For example, if the function is a register, the library function may include a synchronous and asynchronous set reset option available to the user as discussed further in copending patent application Ser. No. 07/787,343 now U.S. Pat. No. 5,337,255. The designer specifies data type and precision (width) of a register as described in copending patent application Ser. No. 07/785,664 Now U.S. Pat. No. 5,422,833; this data type and precision is read by the module generator of the present invention and a corresponding number of flip-flops are allocated for implementing the register. The designer may then specify the particular characteristics of the set/reset data as described in co-pending patent application Ser. No. 07/787,343 now U.S. Pat. No. 5,337,255. The module generator of the present invention will convert this specification to a number of logic elements which will implement the register function. Similarly, if the function is an adder, the designer specifies the data type and precision (e.g., 1's complement, 2's complement, binary, BCD, etc.) which will be implemented by the chip. The module generator can read this information and allocate the appropriate number of logic elements to implement the adder functions.

According to the present invention, modules for efficiently implementing certain high level functions in a particular chip architecture are developed and stored in libraries. When a designer wishes to implement one of these stored higher level functions, he may simply call the module from the library and thereby obtain a module implementation already optimized for the particular chip. This is an advantage to the designer in terms of convenience, and further in optimizing the circuit implementation.

Implementing higher level functions from libraries also avoids repeated optimization effort which results if the designer expresses the logic for higher level functions in terms of primitive logic gates, and the automatic methods for partitioning, placing, and routing must repeat effort because the function is not recognizable when broken into its primitive components. If the designer desires or needs to, he can select the type of implementation in hardware as being one of several "styles" including the above-described "soft macro" higher level functions or "hard macros" in which he specifies exactly how the circuit element is reduced to hardware (the physical chip elements).

The method and apparatus in accordance with the invention are suitable for design and fabrication of all digital logic design, and are not limited to FPGA's or programmable chips.

DETAILED DESCRIPTION OF A PREFERRED EMBODIMENT

Overview of the Module Generator System

Figure 1:
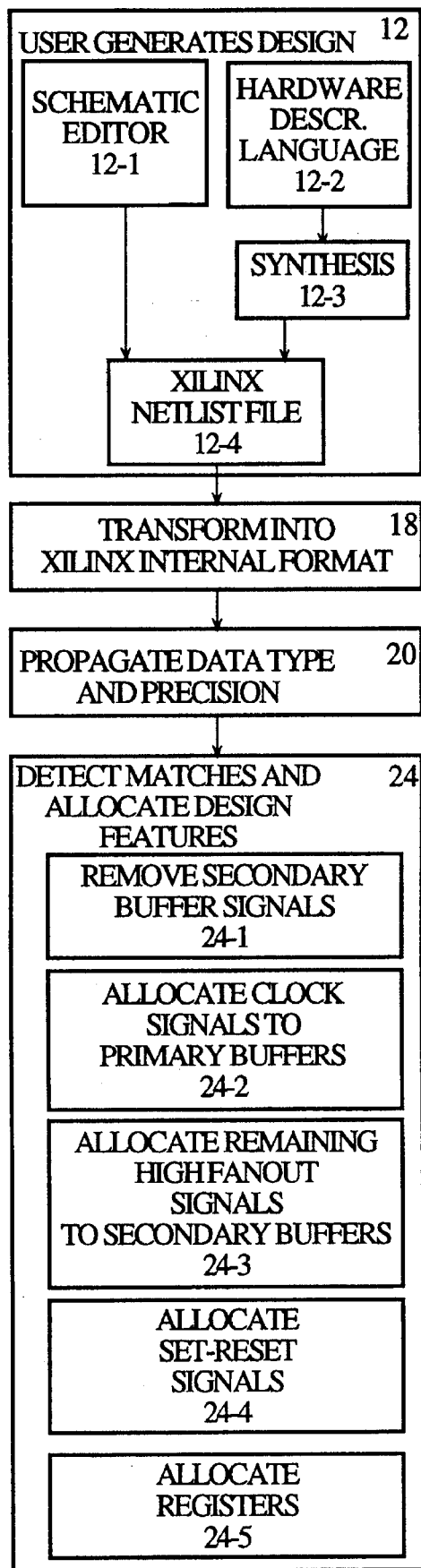
FIG. 1 shows a module generation system in accordance with the invention.
Figure 1:
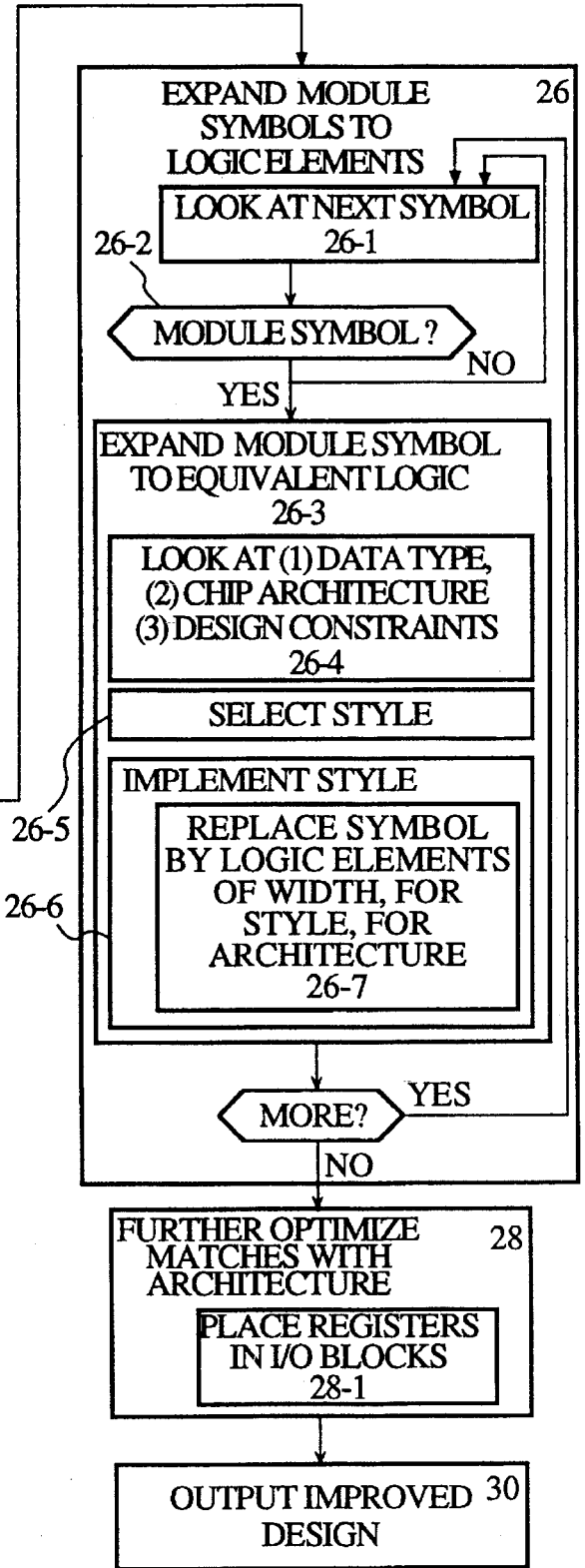

A module generation system in accordance with the invention (called "BLOX") is shown in FIG. 1.

This system provides the following capabilities for the user:

1. Designs are described by the designer at the block diagram level with parameterized modules. The modules can provide thousands of logic implementations for various popular logic functions. Gate-level descriptions are not required. However, a designer can intermix function modules and gate-level primitives in the same design if desired.
2. Designer productivity is greatly increased because designs are at the functional level, not the gate level.
3. A designer need specify the data type and precision of system busses only once, anywhere along the data path. The data types and precisions of data carried on a data path are automatically propagated throughout the design and through levels of the design hierarchy. The bus size of an entire design can be modified by changing just a few data fields on the design schematic.
4. Interfaces are provided to common commercially available schematic capture environments (editors) such as Mentor Graphics®, VIEWlogic®, Cadence®, Data I/O®-FutureNet®, and OrCAD®. Therefore, there is no need for the designer to learn a new tool or new design process.
5. The module generator custom tailors the logic implementation to the specific needs of each module. The implementation of a comparator, for example, will depend on the data type and precision of the data feeding the comparator and whether the equality, greater-than, or less-than outputs (or a combination) are used.
6. Device-specific features are automatically used when applicable. For example, clocking or high fan-out signals are automatically assigned to special high-drive buffers where such are available.
7. The system uses chip vendor specific optimization techniques to boost the performance and density of logic functions, and incorporates expert knowledge of various implementation alternatives.

As shown in FIG. 1, in the system at step 12 a designer generates a logic diagram using a schematic editor such as FutureNet, Cadence, VIEWlogic, OrCAD, or Mentor (12-1) or by the translation from a textual or other graphical language (12-2). A schematic editor allows the designer to represent the logic design in symbols on a computer monitor screen, and to draw lines between functional components to indicate the interconnections between the functional components. The logic design is read into the editor at step 12-1. If a particular functional component is supported by a module master template (drawn from a library of such templates) which tells subsequent software how to implement that functional component in the hardware, the designer may represent that functional component by a simple block in the schematic diagram. Functional components may also be represented by the designer in the schematic diagram by primitive Boolean functions. During the process in step 12-1 or 12-2 of generating the logic diagram, the designer enters data specifying data type and precision at any desired points on the circuit schematic.

After the designer has completed the design, the schematic editor or synthesis program (12-3) generates an output file at step 12-4 in a netlist format which can be used to analyze the logic design, simulate the circuit, create a custom chip, or program a programmable device to implement the design. In the present embodiment, the output file is intended for programming a commercially available Xilinx field programmable gate array chip and is called a Xilinx netlist file or XNF file.

Thus included in the input provided to the schematic editor (FutureNet, Cadence, etc., by the designer) or hardware description language in addition to logic symbols and interconnect lines, according to the present invention, is information specifying data type and precision. Step 18 converts the net list format into a Xilinx internal format that makes it easier to perform the data type propagation method and the following steps.

As an important feature of the present invention, the designer need not provide information on data type and precision for every bus and component in the logic design, because at the next step 20, propagate data type and precision, the data type and bus width provided by the designer at perhaps one or a few places in the logic design in step 12 are propagated to other points in the logic design according to the rules provided in the module master templates of those modules indicated by the designer. This data type propagation serves three purposes: to check data types for consistency or compatibility throughout the design, to save the designer considerable effort in providing the necessary information to complete the logic design, and because data types need to be specified in only a few places, to allow changes in data type to be performed quickly and efficiently.

After the data type propagation step is complete, the method shown in FIG. 1 proceeds with an architectural optimization step 24, in which parts of the design are assigned to parts of the field programmable gate array chip which will implement the design. In this architectural optimization step 24, the requirements of the design are matched with the vendor-specific architectural characteristics of the physical chip to make more efficient use of the resources (circuit elements) on the chip by optimization methods, such as those methods 24-1, 24-2, 24-3, 24-4 shown in step 24 by way of example. Another optimization method (not shown) is to identify arithmetic functions, and combine them with the attached registers or buffers.

It is to be understood that also non-programmable chips and circuits may be designed and fabricated in accordance with the invention.

Before logic functions represented in the designer's block diagram can be placed in the logic array chip, the logic functions indicated in block diagram form are expanded to their full width in step 26 of FIG. 1 in the module generation step. A function designed as an adder, for example, with a 16-bit input bus is replaced by 16 1-bit adders with carry functions interconnected to form the 16-bit adder. Arithmetic functions are expanded using a style called "hard macros" (functions which have been optimized with particular circuit layouts for the particular hardware) to occupy a portion of the logic array chip (or several chips), and in their expanded format are recorded as a net list in an XNF (net list) file.

In step 26, for each module symbol taken one at a time in step 26-1, 26-2, the module symbol is expanded into the equivalent logic at step 26-3. This is done based on data type, chip architecture, and design constraints (step 26-4). The style (implementation mode) is selected in step 26-5 and implemented in step 26-6 by substituting for each symbol the logic elements of the appropriate bus width for the selected style and architecture (step 26-7). This is repeated in step 26 until the entire design has been so processed.

In step 26 the BLOX system in one version provides 30 different parameterized module generators including schematic symbols for several popular schematic editors. These 30 modules provide a designer with thousands of possible logic functions. A partial list of the modules is shown in Table 1.

After completion of module generation in step 26 of FIG. 1, in step 28 further architecture optimization of placing registers in I/O blocks is performed as shown in step 28-1, followed by writing of the system output (a netlist) in step 30, from which the circuit is programmed or fabricated.

TABLE 1

| List of BLOX Modules | |
| --- | --- |
| Adders/Subtracters | Accumulators |
| Data Registers | Shift Registers |
| SRAMS | PROMS |
| Comparators | Inputs |
| Outputs | Bus Interfaces |
| Bidirectional I/Os | Counters |
| Multiplexers | Bus Inversions |
| Force a value onto a bus | Bus-Wide Boolean Functions |
| Three-State Buffers | |

The bus-wide Boolean functions offer different ways to perform an AND, OR, or XOR operation on the bits of a bus in the following manner:

1. AND/OR/XOR all of the bits of the bus together and provide a single-bit output. For example, XOR all the elements of a bus to build an even parity generator.
2. AND/OR/XOR bits from one bus with corresponding bits from a second bus and provide a bus-wide output.
3. AND/OR/XOR each bit of a bus with a single-bit input and provide a bus-wide output. The single-bit input is usually a control signal such as an enable.

Figure 2:
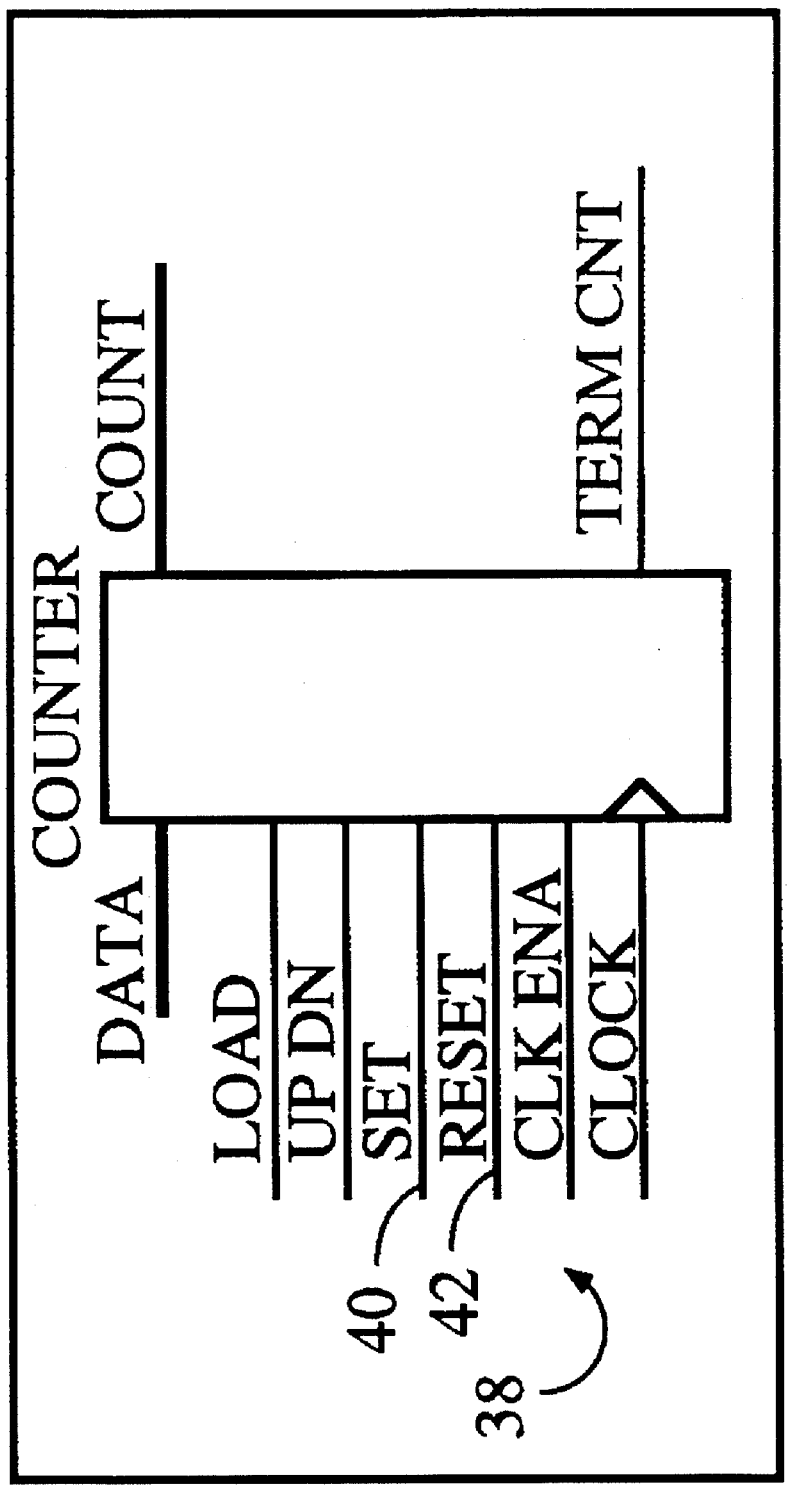
FIG. 2 shows a counter module.

The designer may attach various parameters to a specific module. This capability allows a designer to build a very large number of different implementations for a particular function. For example, the counter module (COUNTER) 38 shown in FIG. 2 can have the parameters listed in Table 2 to control the asynchronous 40 and synchronous 42 functions plus the counter's counting sequence.

TABLE 2

| Parameters Available on COUNTER Module. | |
| --- | --- |
| Parameter | Value |
| Asynch_val | SET |
| | RESET |
| | -VALUE- |
| Synch_val | SET |
| | RESET |
| | -VALUE- |
| SEQUENCE | BINARY (default) |
| | JOHNSON (circular counters) |
| | LFSR (linear feedback shift register) |

Considering just the counter widths between 1 and 32 bits, this allows over 60 billion unique implementations of counters. This does not include the other variations provided by preloading, clock enabling, and up/down control.

Figure 3A:
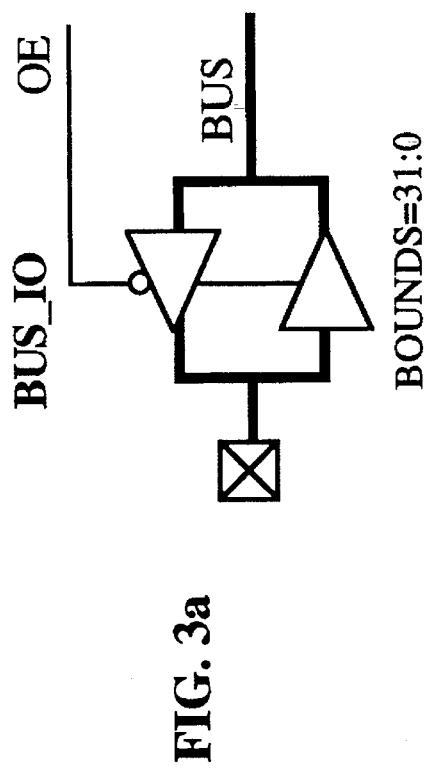
FIGS. 3(a) and 3(b) show two representations of a bidirectional input-output symbol which may be connected to a data bus.
Figure 3B:
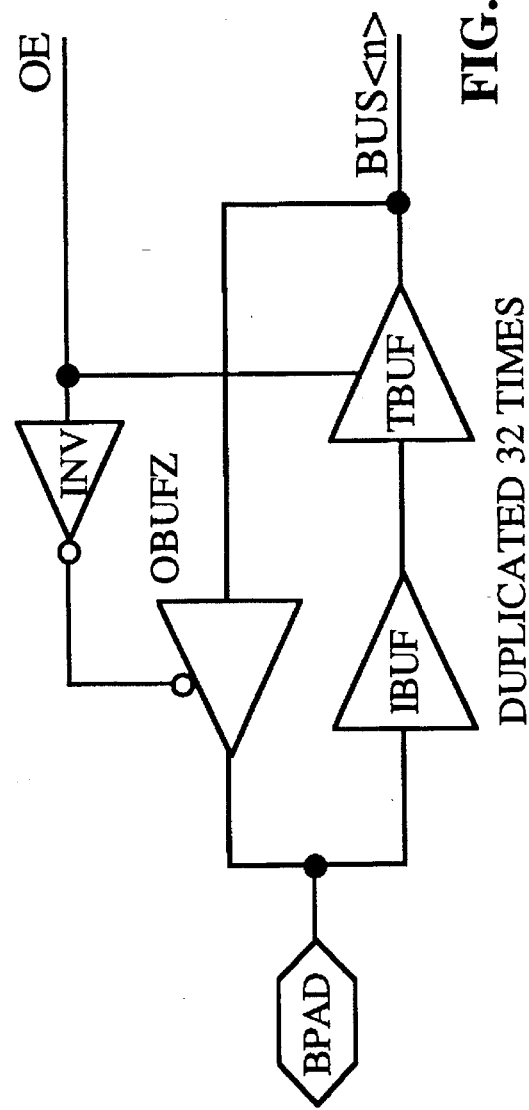

The module generator also enhances the designer's productivity. The amount of time required to enter a design is significantly reduced since the designer enters the design at the block diagram level. For example, entering a 32-bit bidirectional input-output port which connects to a data bus is quite tedious if drawn at the gate level as done in the prior art. To enter such a structure requires drawing 32 gate-level representations, only one of which is shown in FIG. 3(b). This simple example for 32 bits requires 129 symbols, 322 wire connections, and 227 labels. Using the BUS_IO module generator in accordance with the invention, the same design shown in FIG. 3(a) requires only one symbol, two wire connections, two labels, and one parameter describing the bounds, data type and precision of the bus. Likewise, the schematic is significantly easier to view because the entire I/O bus interface in FIG. 3(a) fits in a small portion of an "A" size drawing. The same cannot be said of the gate-level drawing of FIG. 3(b) when replicated 32 times.

The data propagation feature is extremely useful, especially if the size of the data path changes. Instead of having to add or remove logic on the schematic, the designer need change only the precision of the data type for the data bus via a parameter on any of the I/O module symbols. The BLOX system automatically propagates that information throughout the design.

Module generators help implement the actual design. The designer need not worry how best to implement a given function. He merely lets the BLOX system optimize and expand the design based on how the module is used. For example, the XC4000 FPGA device has specific logic designed to increase the performance and density of arithmetic functions like adders and counters. To use this special logic, a designer in the prior art used predefined "hard macro" implementations of these functions with fixed data path widths. With the BLOX system, however, the designer can create custom adders and counters of various sizes automatically. The BLOX system will create the hard macros and also incorporate registers and tristate buffers into the hard macros if they are used in the design.

Furthermore, the architectural optimizations obtain the maximum density and performance from a design. In many cases, a designer may be unaware of special features or design techniques for the device. The BLOX system automatically transforms the logic to use these features. For example, Xilinx XC4000 devices have flip-flops in the input/output blocks. Instead of using the flip-flops in the internal core, the BLOX software will move data registers and flip-flops into the I/O blocks when applicable.

Figure 4:
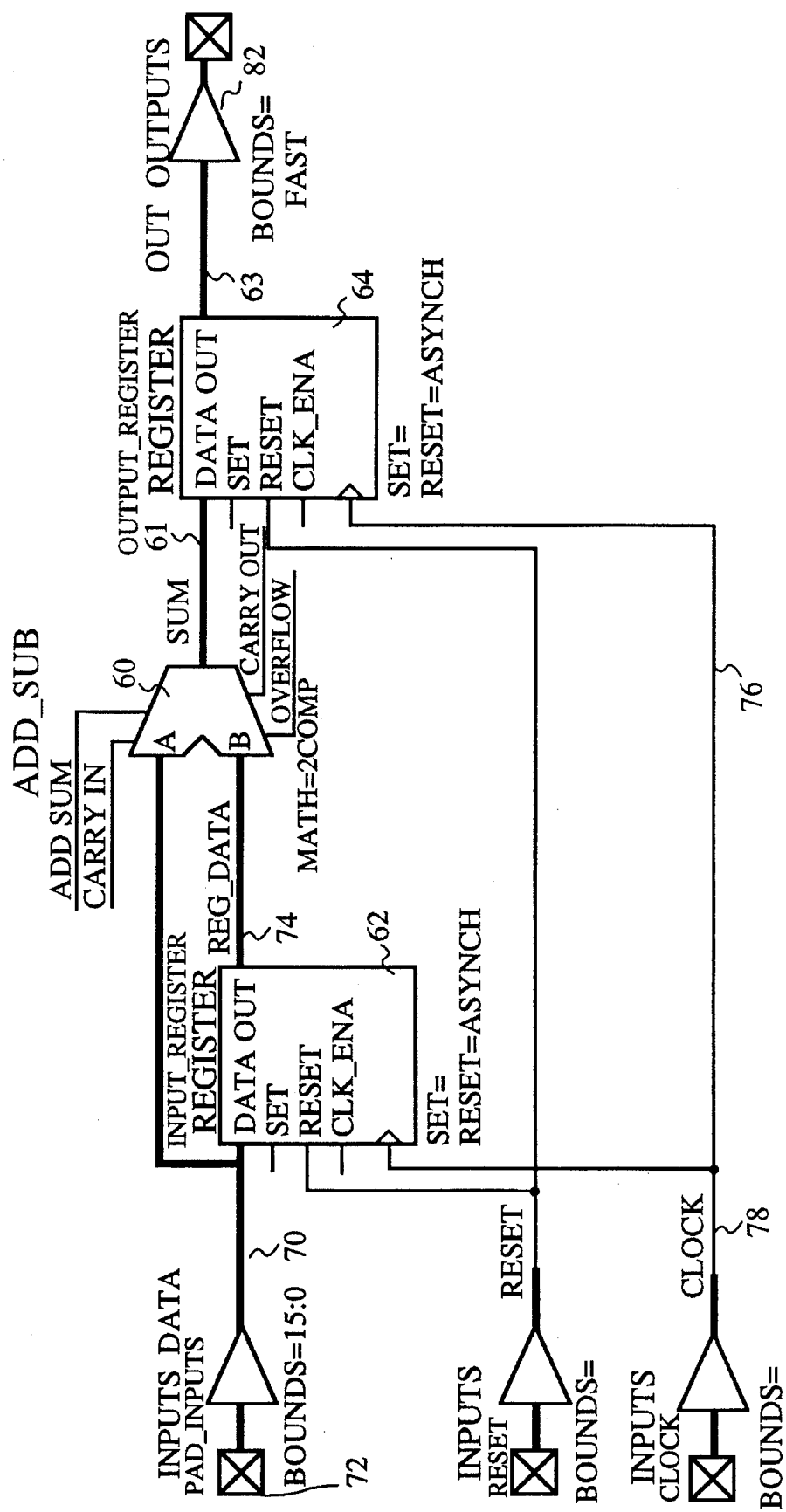
FIG. 4 shows a complete design for a 16-bit registered adder in accordance with the invention.
Figure 5:
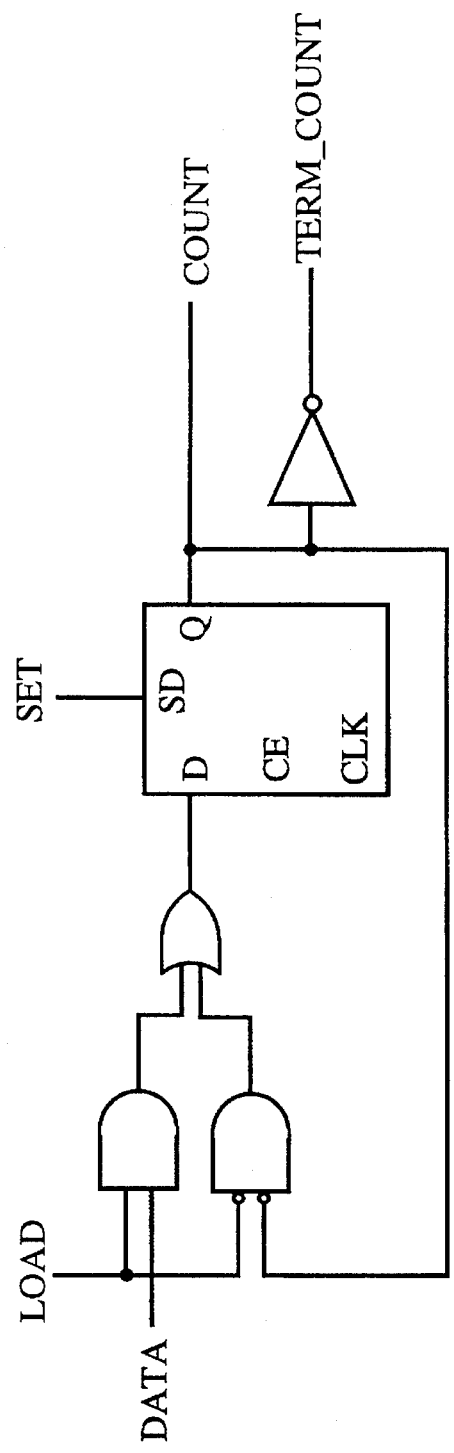
FIG. 5 shows feedback for a two-count counter.

A circuit defined in the BLOX system is shown in an example in FIG. 4 which is a block diagram for a simple design incorporating a 16-bit adder 60, two 16-bit data registers 62,64 plus various input and output pins.

In accordance with the invention, FIG. 4 is more than just a block diagram; it also is the complete design drawn with the conventional VIEWlogic schematic editor (the design appears similar in other editors). Note that the size of the data path 70, 74, 61, 63 is 16 bits wide. The precision (bounds) of the data type for the bus is set on the INPUTS symbol feeding the first register.

The design is processed by the BLOX system after being translated from the VIEWlogic format into the so-called Xilinx Netlist Format (XNF).

The BLOX system first expands the data types on the data path. Because (in this example) the data type is defined only on the INPUTS symbol 72, the BLOX system must determine the data types and precisions of all the other modules and buses. Because the REGISTER module 62 is attached to the INPUTS module 72 via the DATA bus 70, the BLOX system deduces that the REG_DATA output bus 74 is the same data type and precision as the DATA input bus 70. This process continues until the data type and precision of all networks with the design are resolved.

The next step is the architectural optimization of the design. The BLOX system improves the design by mapping logic functions into the special features (in this example) of the Xilinx XC4000, where applicable. In this example, the BLOX system software determines that both registers 62, 64 share a common asynchronous reset connection 76. Since the XC4000 devices have a special dedicated global set/reset function, the BLOX system removes the RESET signal from the two REGISTERS 62,64 and automatically attaches to the global set/reset function.

Likewise, the BLOX system notices that the CLOCK signal 78 feeds 32 flip-flops (or two 16-bit REGISTERs 62,64). It therefore assigns the CLOCK signal 78 to one of the eight high-drive, low-skew buffers within the chip. This creates a fast, high fan-out clock distribution network with a delay of only 5.7 nanoseconds to all 32 flip-flops.

Next, the BLOX system decides that the adder function 60 (ADD_SUB) should be implemented using the special fast-carry logic on XC4000 devices. It will automatically create a hard macro for the adder when it is expanded. Furthermore, the BLOX system notices that the second REGISTER 64 connected to OUT 82 can be incorporated into the same hard macro.

Finally, the BLOX system notices that the first REGISTER 62 driving REG_DATA 74 can be folded into flip-flops located in the I/O blocks used for the INPUTS symbol. Implementing the first register in this manner reduces density by reducing the number of logic blocks in the core of the chip, thus allowing the designers to later add more functions to the design.

The next major step is module expansion where the BLOX system builds the specific implementations for each module. For this example, it will build a netlist description for the INPUTS 72, OUTPUTS 82 and the REGISTER 62 driving the REG_DATA bus. However, the software will build a hard macro for the adder 60 combined with the REGISTER 64 driving the OUT bus.

After using the BLOX system, the design is placed and routed on the chip using other conventional software. The entire above design example requires 34 I/O blocks and only nine logic blocks on an XC4000 device.

If the designer now decides to build the same basic function but with a 32-bit data path, there would be only one change required on the schematic of FIG. 4. The BOUNDS parameter on the INPUTS module 72 would be changed from '15:0' to '31:0' and then the design reprocessed with the BLOX system.

The following detailed description is of the computer program which implements the preferred embodiment (BLOX) of the invention. The computer program is written in the Quintus Prolog language, commercially available from Quintus Corp. The following portion of the detailed description is structured so that one of ordinary skill in the art could write a computer program to carry out the invention by following the detailed description. For other embodiments, the program could be written in other programming languages and/or structured differently. Certain extracts of the computer program are shown herein for clarity and illustration.

Module Expansion

This section describes the expansion of modules in a XIF (Xilinx Internal Format) netlist structure into their implementation in terms of other primitives.

expand-modules

The netlist is expanded and the result is a new netlist. All BLOX symbols are expanded and all of the modules must have the same form of parameters. The parameters are as follows:

1. The type of BLOX symbol to be expanded.
2. The name of the BLOX symbol to be expanded.
3. The input-output connections to the BLOX symbol. This is represented as a two-element list. The first item in the list is a list of the names of signals that are inputs to the symbol. The second item in the list is a list of the names of signals that are outputs of the symbol.
4. The defining source line or list of source lines of this symbol in the XNF file.
5. The symbol graph representing the symbols (sub-graph or sub-circuit) that implement the BLOX symbol.

If for any reason the module expansion fails, the symbol is left as it was and the next symbol is examined. For example, if the symbol at the head of the symbol graph list is not a BLOX symbol, no expansion can be done.

SRAMs Description

This module takes a SRAM symbol and creates an XNF symbol body with an appropriate FILE=attribute that points to the data file. The first step is to expand the DATA_IN, ADDRESS and DATA_OUT busses. The ADDRESS input must be one to eight bits wide while the DATA_OUT output must be one to 32 bits wide. If these ports are of the wrong size, report the error and stop.

The following steps are used to generate an SRAM:
1. Determine the depth of the RAM memory. If the depth is not specified, the depth is equal to the maximum address represented by the width of the address input.
2. For each bit of the bus ports, derive an appropriate pin name for the symbol.
3. Create a memory description for the module if it does not already exist.
4. Create a name for the SRAM function based on the module type (SRAM), the Symbol_Depth, and the Output_Width. If the file already exists, then there is no need to recreate it.
5. Assert the proper data for the symbol.

PROMs Description

This module takes a PROM symbol and creates an XNF symbol body with an appropriate FILE=attribute that points to the data file. The steps are:

1. Determine the name of the data file for the ROM memory. If not specified, then contents are set to all zeroes. The user is warned if this occurs.
2. Expand the ADDRESS and DATA_OUT busses.
3. The ADDRESS input must be one to eight bits wide while the OUTPUTS output must be one to 32 bits wide. If these ports are of the wrong size, report the error and stop.
4. Determine the depth of the ROM memory. If the depth is not specified, the depth is equal to the maximum address represented by the width of the address input.
5. Check to see if the memory DATA file exists.
6. For each bit of the address bus, derive an appropriate pin name for the symbol.
7. For each bit of the output bus, derive an appropriate pin name.
8. Assert the proper data for the symbol.

Data Registers

This section describes generation of Xilinx Netlist Format (XNF) symbols from the parameterized BLOX REGISTER primitive.

Transformations

The BLOX symbol REGISTER is expanded into an array of XNF flip-flop symbols. The specific symbols may be DFFs, INFFs, or OUTFFs depending on where the data register is to reside within the chip. The location is determined during the architectural optimization step and is set via the FFTYPE directive added to the parameter list. The steps required to expand the REGISTER primitive are:

1. Determine if there are any REGISTER primitives in the design. If not, then succeed and return.
2. Determine the width of the DATA inputs and Q outputs on the REGISTER primitive. The width of DATA should match Q. Determine the final resting place of the flip-flops used to build the REGISTER by looking at the FFTYPE directive. If FFTYPE=DFF, then the flip-flops go inside a CLB. If FFTYPE=INFF or FFTYPE=OUTFF, then the flip-flops belong inside an IOB.
3. Based on the width of the REGISTER and the value of FFTYPE, generate the appropriate number of DFF, INFF, or OUTFF primitives.

Shift Registers

This section describes generation of Netlist Format (XNF) symbols from the parameterized BLOX SHIFT primitive.

SHIFT

The BLOX symbol SHIFT is expanded into an array of XNF flip-flop symbols. The specific symbols may be DFFs, INFFs, or OUTFFs depending on where the shift register is to reside within the chip. The location is determined during the architectural optimization step and is set via the FFTYPE directive added to the parameter list. The steps required to expand the SHIFT primitive are:

1. Determine if there are any SHIFT primitives in the design. If not, then succeed and return.
2. Determine the width of the DATA inputs and SHIFT outputs on the SHIFT primitive. Only one need be specified because the shift register may be parallel-to-serial, serial-to-parallel, or serial-to-serial.
3. Determine to final resting place of the flip-flops used to build the SHIFT by looking at the FFTYPE directive. If FFTYPE=DFF, then the flip-flops go inside a CLB. If FFTYPE=INFF or FFTYPE=OUTFF, then the flip-flops belong inside an IOB.
4. Based on the width of the SHIFT symbol and the value of FFTYPE, generate the appropriate number of DFF, INFF, or OUTFF primitives.

Error Checking and Defaults for SHIFT Symbol

Setting Default Values on Unconnected SHIFT_IN Inputs

The steps are:

1. If left unconnected, the SHIFT_IN inputs on the symbol will be tied to GND.
2. Find the types of both the DATA and SHIFT connections on the SHIFT symbol. Also determine the basename of these connections and the left and right bounds of the busses.
3. If either the parallel data input or the shift output is left unconnected, set one to the width of the other and create a dummy name for the input or output.

For the DATA parallel input and the SHIFT parallel output:

The steps are:

1. Determine the width of the DATA and SHIFT busses. The bus width defines the width of the shift register. If the width of the DATA input does not match the width of the SHIFT output, then issue an error.
2. Generate a list of the subscripts for the DATA and SHIFT busses.
3. To generate all the flip-flops required to expand the SHIFT symbol, find all the solutions for the list of subscripts for the SHIFT bus.

To do so,

1. For each possible subscript for the SHIFT bus,
2. Find a corresponding subscript for the DATA bus, and
3. Find a corresponding output name from the SHIFT bus, and
4. Find a corresponding input name from the DATA bus, and then
5. Build the appropriate flip-flop.
6. Return a graph of all the generated flip-flops.

4. After building the shift-register flip-flops, then connect the most-significant bit (the left-most flip-flop) to the SHIFT_OUT_L output and the least-significant bit (the right-most flip-flop) to the SHIFT_OUT_R output.
5. Merge the returned graphs into a single graph that can be integrated into the global signal and symbol graphs.

create_shift_flop/5 for Building a Single Flip-Flop

The create_flip_flop function builds and individual flip-flops for the shift register and its corresponding symbol and signal graphs. The inputs and outputs for the function include:

1. +Shift_Inputs—A list containing the input signals attached to the shift register flip-flop.
2. +Shift_Output—A list containing the output signal from the shift register flip-flop.
3. +Symbol—an atom describing the name of this instance of the SHIFT symbol.
4. +Parameters—a list containing the parameters for the shift register symbol.
5. −Symbol_Graph—the returned graph of flip-flop and gate symbols.

The steps are:

1. Based on the signal attached to the RIGHT_LEFT shift direction input on the shift register, either pass along the previous or following shift output or create a 2:1 multiplexer with both.
2. Based on the signal attached to the LOAD input on the shift register, either pass along the output from the previous code or build a 2:1 multiplexer selecting between the shift data or parallel data from the DATA input.
3. After building any logic to handle the direction of the shift and parallel load, the remainder is a simple flip-flop.

Arithmetic and Logic Module Generators

This section describes the arithmetic and logic module generators.

Arithmetic Hard Macro Function

Transformations

The BLOX symbols ADD_SUB, COUNTER, and ACCUM are all arithmetic functions that benefit from hard macros. Also, the problems of defining the carry structure is similar for these functions. One limitation of the way hard macros are specified is that they cannot integrate flip-flops or TBUFs unless they are part of the original hard macro definition. An arch_opt function integrates flip-flops with ADD_SUB functions and TBUFs into ADD_SUBs, COUNTERs, and ACCUMulators. The new function into which the others are integrated is called ARITH.

General Arithmetic Hard Macro Module-ARITH

This function processes and creates an XNF symbol body for an arithmetic hard macro. The steps are:

1. Check to see that the symbol is connected correctly. If not, then report any violations or warnings.
2. Determine which kind of function this instance of ARITH is supposed to perform. It will be either an adder/subtracter, an up and/or down counter, or an accumulator. If the function is not defined as one of these, then issue an error.
3. Determine the type of arithmetic to be used with the ARITH function. It must be either UNSIGNED or 2COMPlement. If undefined, then assume that the arithmetic will be for unsigned numbers.
4. Determine the synchronous and asynchronous lists for the register if one is utilized.
5. Check the SUM output. If it is left unconnected, then the output is attached to an array of unconnected elements. The single-bit case is handled.
6. Check the Q output. If it is left unconnected, then the output is removed from the list of signal connections. The single-bit case is handled.
7. If the Q outputs are attached, then the reported output of the symbol will be the net attached to Q. Otherwise, it will be the net attached to SUM. The symbol checker guarantees that at least one net is attached to the symbol.
8. Check the O output. If it is left unconnected, then the output is removed from the list of signal connections. The single-bit case is handled. Check also if the ARITH function has too many TBUFs for the part type.
9. If the arithmetic is UNSIGNED and the overflow pin (OFL) is connected, then overflow is equivalent to carry out (CO). If true, then a buffer is created connecting carry out to the user-specified overflow signal.
10. Create a list of all the output pins on the symbol.
11. Next, check the A input. If it is left unconnected, then the input is removed from the list of signal connections. The single-bit case is handled.
12. Next, check the B input. If it is left unconnected, then the input is removed from the list of signal connections. The single-bit case is handled.
13. Next, check the I input. If it is left unconnected, then the input is removed from the list of signal connections. The single-bit case is handled.

The ARITH symbol requires unique pin names for the inputs and outputs. If an output signal is fed back into an input on the same hard macros (i.e., counter or accumulator feedback), then that signal is removed from the list of input signals. The steps are:

1. Ensure that the input list has all unique names.
2. Remove everything in the input list that appears in the output list.
3. Now that all of the symbol pins have been processed, create the actual hard macro symbol. Create a unique file name for the hard macro. Unfortunately, the symbol name will not work since it may be more than eight characters long which violates the DOS naming restrictions. The generate_HM_filename)/1 function will create a unique file name. The generate_HM_filename/1 function will return a unique file name for a hard macro. It keeps searching through all possible names until a unique one is available. All HM filenames will have a BLOX prefix.
4. Then, assert the symbol record into the data base and its associated arch_pins record.
5. Determine the values for the carry chain and the equations for the carry out and/or overflow pin, if attached. Also, determine the equations for the first F function and for the F and G functions in the remaining CLBs.
6. If the Sum_Outputs are left unconnected, then the Q_Outputs will definitely be connected. Since the Sum_Outputs values are required to generate net names within the hard macro, a list of names called HM_Sum_Outputs is created.
7. If Sum_Outputs is unconnected, then create values for it based from the values of the Q_outputs. If Sum_Outputs is connected, then the Sum_Outputs names are used.
8. If the function has a synchronous SET signal (and a synchronous RESET in this special case), then is will be coming in via the same logic inputs as any B inputs. Replace the B signals with an array of whatever is derived from F2 from the get_equations/14 function.

Determining the Carry Function

The get_carry_function/4 returns the carry function values for the least-significant block (LSB), the middle set of blocks, and the most-significant blocks (MSB) for a set of hard macro blocks. Depending on the values of CO, OFL, Output_Width, and MATH=, the carry function for the MSB will vary. The steps are:

1. Now determine how the ADD SUB, CO, and OFL connections are attached.
2. If ADD_SUB is HIGH, then the function is an adder. If LOW, then the function is a subtracter. If driven by a net, then the function is dynamically switchable between an adder and subtracter. If left unconnected, the function is also an adder (the same as if connected HIGH).
3. The type of signals can be determined using make_connection_list/2.
4. If the ADD_SUB pin is not connected, then assume that it is set to HIGH.
5. If MATH=UNSIGNED and the OFL pin is connected, then guarantee that the carry-out signal (CO) is considered connected. This is done because an overflow condition for an unsigned number is equivalent to the overflow.
6. If the OFL connection is really used (i.e., the type of data is 2COMP), then the equation for overflow is the XOR of carry in and the carry out of the most-significant bit (the sign bit).

7. Build the final carry values type appending the Carry_Type and the specific function for LSB, Middle, MSB, Special, and Extra. If Extra or Special are unused, then they are set to empty lists.

Most-Significant Block and Extra Functions

Since an ARITH function may have carry-out and/or overflow, the arithmetic hard macro function will fit into different sizes depending on which outputs are used, and whether the width is odd or even. An * indicates that the signal is not connected while a c indicates that it is connected. A 0 indicates that the width is even while a 1 indicates that it is odd.

Determining the Function Generator Equations

The get_equations/9 function determines the equations for the F and G function generators. The values of the equations depend on the basic function type (i.e. ADD_SUB) and the various control inputs to any flip-flops contained in the hard macro. The steps are:

1. First, check to see how the Add_Sub, Carry_In, Load, Set, and Reset connections are used. These inputs all affect the type of equations required to implement the function.
2. If Add_Sub is left unconnected, then assume that the function is an adder or incrementer (i.e., assume that Add_Sub is tied HIGH).
3. Next, determine the base equations for both the F and G function generators. The equation will be depend on the Function, and whether Add_Sub is tied HIGH, LOW or is dynamic. Also determine the equation for the F function generator within the least-significant block. Its value is dependent on how both Add_Sub and Carry_In are connected.
4. If the ARITH function has flip-flops in it, then determine if any of the control functions like asynch-ctrl, synch-ctrl, or Load are being used. If the Add_Sub pin is connected, then it consumes one of the inputs to each function generator. Therefore, not all combinations of the control inputs are possible simultaneously. For example, using Add_Sub with ADD_SUB or ACCUM functions consumes all the function generator inputs.
5. The equations for both the F and G function generators are built by appending the prefix and suffix for control functions to the base equation used to produce the sum output. If there are no control signals for the flip-flops, then the final equation is equal to the base equation determined earlier.

Base Equations for Arithmetic Functions

The base equation for an arithmetic function depends on the basic function type (i.e., ADD_SUB, ACCUM, etc.) and the value of the Add_Sub input. If left unconnected or tied HIGH or LOW, the base equations are simplified since they are missing an input. If Add_Sub is connected, then the equation is more complex.

The F Function in the Least-Significant Block

The F function generator within the least-significant block (i.e., A0, or Q0), initiates the carry chain with the appropriate logic level. The carry chain is fed with either a LOW, a HIGH, or a dynamic value depending on the values of Add_Sub and Carry_In. For example, if Add_Sub is unconnected or tied HIGH, then the function is an adder or incrementer. Furthermore, if Carry_In is left unconnected, then the carry chain should be initiated with a LOW or GND. Conversely, if Add_Sub is tied LOW, then the function is a subtracter or decrementer and the carry chain should be initiated with a HIGH (since a LOW indicates a borrow for 2's complement arithmetic). The returned value is the equation for the F function generator in the least-significant block.

Prefixes and Suffixes to Base Equations

If the flip-flops are used in the ARITH function, then the flip-flops can have additional controls such as asynch-ctrl, synch-ctrl, and Load. If these controls are used, then the base equations can be included within a more complex equation for synchronous set, synchronous reset, parallel loading, and asynchronous reset.

Generating the Hard Macro File

All of the information necessary to generate the hard-macro file is provided in the arith_hard_macro/6 function. The structure of this function is:

```
arith_hard_macro(
    Symbol_name,
    [External_Inputs, External_Outputs],
    [HM_Inputs,       HM_Outputs],
    Width,
    Equations,
    Carry_Function).
```

When arith_hard_macro/7 is called, it uses the information passed to it to construct the hard_macro file. Much of the file is pre-designated, so it can be produced with format/2. The File name is constructed by adding ".hm" to the Symbol_name. The Nets are mostly passed in, but the busses have to be expanded. The steps following are:

1. The file name is created for the hard-macro symbol name, which was created earlier as part of the assertion of the hard macro symbol.
2. The number of MXN architecture instances is determined by the Width of the input data buses. This also helps determine the size of the hard macro.
3. The first four lines of the MXN file only require the Symbol name. The date is obtained from the system.
4. Write out the MXN cell information including the cell name, its size in rows and columns, and the interface list showing both the signal names and the instance values.
5. The four MXN primitives never change, so they are merely copied into the file.
6. The net lists are built by examining the external signals, and putting each of the unique, connected external signals on a net. The internal nets are called 'INT' followed by the number of the CLB in the hard_macro (see pic/3).
7. The MXN body is built from the information provided. Each CLB has three or four architectures associated with it, and the position is generated as in pic/3.
8. The end of the MXN body is also the beginning of the PIC body and in just four lines that are copied verbatim into the file.

9. The PIC body depends on the number of Rows and Columns in the hard macro, and the Width of the input data buses. Everything else is just a simple calculation from those values.
10. The end of the PIC body is just two lines that are copied into the file.
11. The stream is closed because the complete file has been written.

The expansion of step 3 is as follows:
1. The size of the hard macro in Rows and Columns is a simple function of the width of the data buses, and whether there are any special or extra CLBs required.
2. Return 0 for Extra or Special CLBs. These may be required to compute carry-out and overflow under certain bit widths. If they are not used, otherwise return the number of the CLB that is appropriate.
3. To find the number of available rows and columns, the part number is needed.
4. The first (bit location zero) ARITH function is special. The ARITH element is only written when the bit location is even. Also, the F functions are written when the bit location is even and G is written when odd.
5. The zeroth location is also important since this is where the carry chain is started. If there is a CARRY_IN input on the symbol, then it is used to start the carry chain. Else, a VCC or GND is fed in as the carry chain through a special internal signal called START_CARRY.
6. If the current bit position is even, the write the F function generator, else write G. If the sum output is unconnected, then do nothing.
7. TBUFs and flip-flops are not generated for anything but the data path. They are not generated when the initial carry-generate is created and they are not generated when the carry-out and overflow bits are created. Furthermore, they are only generated when there is data on the output.
8. The function is complete when Width is the same width as Total_Width. If not equal to Total_Width, then increment and keep on going.

The PIC Body

1. The PIC body is built based on a list of pic_record/4s created when writing the MXN body.
2. The locations have to snake back and forth when the carry-chain reaches the top or bottom of a column.

Counters

Generating Counters

This function processes counters other than those of STYLE=BINARY since those have presumably been placed in ARITH symbols during architectural optimization. The only Styles of counters left should have STYLEs equal to JOHNSON or to LFSR (Linear Feedback Shift Register). If no style is specified or an improper style is specified, an LFSR style will be used. The steps are:
1. The first step is to see if all of the signals are properly connected and all of the parameters are valid. While doing this, the width of the input bus and/or the output bus of the counter will be determined.
2. If both the Data input and the Count output are NOT connected, then there must be a modulus specified in the parameters. However, if either the Data input or the Count input is connected, then the modulus need not be specified.
3. One option is for the modulus to be used in combination with the counter Style to determine the width of the Data input and the Count output so that dummy signals can be connected to them. Another is for the width of either the Data input or the Count output to be used to determine the modulus. The final option occurs when a modulus is specified and the Data input and the Count output widths are specified, in which case a consistency check is done.
4. The width of the Data input and the Count output must be the same. Note that the widths of the Data input and Count output have already been checked in the data_type_propagation, and must be the same.
5. Check to see that the symbol is now connected correctly. If not, then report any violations or warnings.
6. Create the counter based on the information obtained so far.

Finding the Width of the Counter

Several basic cases are considered in finding the width of the counter:
1. The modulus of the counter is given, but neither the Data input or the Count output is given. In this case the width of the counter is determined by the modulus and the counter style.
2. The modulus of the counter is not given, but either the Data input or the Count output is given. In this case the width of the counter is determined by the width of the attached BUS. The modulus is assumed to be the maximum possible modulus.
3. The modulus of the counter is given and either or both of the Data input and the Count output is given. In this case the width of the counter is determined by the width of the attached BUS, but a consistency check is done with the modulus. If the modulus is not consistent, an error is issued.
4. If none of the preceding conditions is met, an error is issued.

Finding the modulus given a known width and style of counter is straightforward. If the counter is a JOHNSON counter, then the maximum count is twice the width. If the counter is an LFSR counter, then the maximum count is $2^n-1$. (It is possible to modify an LFSR counter to count to $2^n$, but with the XC 4000 architecture, it is faster to simply add another register.)

Finding the width of the counter from a given modulus is also straightforward. If the counter is a JOHNSON counter, then the width is the modulus divided by two and rounded up to the nearest integer. If the counter is an LFSR counter, then the width is the minimum bit width required to represent the modulus. Note that it is more efficient to implement an LFSR counter which counts to a power of two by using an additional register. If there is an error in how the counter parameters have been input by the user, an error message is written that gives the name of the symbol and the style of counter to be constructed.

Determining the Style of the Counter

A counter can not be built for a modulus less than 1, or if an error has occurred, and the modulus is undefined. In either of these cases a counter will not be built and an error message will be displayed. If the modulus is one or two it is treated as a special case. Otherwise, the counter style that is specified in the parameters is used.

Ensuring the Module Connections

This section checks the inputs and outputs to ensure that they are properly connected before the module is generated. The steps are:

1. The first one to be checked is the COUNT output. If the COUNT outputs from the counter are not connected, then build the outputs based on the width of the DATA input. Data is guaranteed to be present if the symbol passed the symbol checking performed earlier.
2. If the Up_Dn is currently not connected, then the counter will count up (connect Up_Dn to h).
3. There must be a valid signal attached to the Term_Count pin. If the termination count (Term_Count) signal isn't connected, then create a name for it. Otherwise, use its value. The symbol graph will ultimately be modified to use either the new name or the previously valid name.
4. If Count is not connected, then we need to create a bus for it. This is done by using the Data bus if it is connected, otherwise a bus is created based on the Width of the counter that was determined earlier.
5. If there is no connection to the Up_Dn input, then it is assumed to be an UP counter, so it is forced to be high. Otherwise, the actual signal is used.

Building NO Counter

If there is an error in the specification of the counter, then no counter will be built and an error message will be displayed.

Building a 'Count to one' Counter

A special counter is used to count to one. This is a really trivial case, but it still needs to be handled correctly. This counter can be asynchronously or synchronously set or reset and may be an UP, DOWN or UP_DN counter. A single flip-flop is used.

Building a 'Count to Two' Counter

A special counter is used to count to two since neither the JOHNSON nor the LFSR counter will do it well. A single flip-flop is used.

Building Johnson Counters

The steps are:
1. If the function style is JOHNSON, then build a Johnson counter. Johnson counters must have a width of two or greater.
2. Determine which style of synchronous and asynchronous reset are used.
3. The logic to determine the terminal count is created and a graph of the symbol used to determine the terminal count is returned.

Terminal Count Logic

The steps are:

1. In order to find the terminal count, the value of Up_Dn is examined. If the counter is a simple Up or Down counter, then a single AND gate is used to generate the terminal count. Otherwise, both the Up and Down are combined with the Up_Dn signal in the terminal count logic to determine the terminal count. For an Up counter, the two MSBs are used. For a Down counter the two LSBs are used.
2. For the Up counter the two most-significant bits of the shift register will be the first and second elements in the list of the signals that comprises 'COUNT'.
3. For a Down counter, create a reversed copy of the Count bus. The first two elements of the reversed list will be the two least-significant-bits.
4. For an Up_Dn counter we create two AND gates and an OR gate to determine the terminal count, and a pair of XOR gates and AND gates for the feedback logic.
5. The terminal count is created and the feedback is determined.

Feedback Logic for Johnson Counters

The feedback logic depends if the counter modulus is odd or even. It will always be even unless the user has specifically added an odd MODULUS parameter to the symbol. If the modulus is even, then the feedback is a simple inverter. If the modulus is odd than an XOR of the two LSBs or MSBs is used. Depending on whether the counter is just an up counter or down counter, or an up-down counter, a different feedback structure will be used.

Feedback for Up-Counting on Johnson Counters

Building Linear Feedback Shift Registers

This section builds linear feedback shift registers (LFSRs). The steps are:

1. Because the module generator only has knowledge of how to build counters from two to eighty bits, check to make sure that the LFSR counter has a valid width. In fact, currently counters must be less than or equal to 31 bits, and unless you're on a CRAY, 23 bits is a practical limit.
2. Determine the general structure of the register. If the synch_val or asynch_val is 'SET' it is an error.
3. Check to make sure that the counter isn't a down or up/down LFSR counter.

Determining the LFSR Taps

The steps are:
1. To force an LFSR counter to go through its paces, there are a pre-determined set of taps from the COUNT outputs that need to be fed into an XNOR function. There are asserted facts for lfsr_taps/2. The signals on the input bus that correspond to the positions on the Tap_List are collected into a list.
2. If the LFSR counter counts to some other value (than $2^{n-1}$), then determine the Jump_Vector that forces the counter to count to the Modulus value. An n-bit LFSR counter can produce a pseudorandom sequence of up to $2^n-1$ unique states. By adding logic to the feedback path, the LFSR counter can be forced to skip any number of states (from one to $2^n-1$). By forcing the counter to skip M states, a LFSR counter can implement any modulus (modulus=$2^n$−1−M) where n is the number of shift register bits.

3. To help maintain high performance, the ANDing of the bits should be pipelined to keep clock-to-clock delays to a minimum. Therefore, the ANDing should be done up to four bits at a time.

get_lfsr_values

The function get_lfsr_values/5 takes the Counter_Width, Tap_List, and Skip_Distance and returns the Jump_Vector that should be decoded and the Initial_State which is the state after the "skipped" states. get_lfsr_values/5 actually calls get_lfsr_lists/6 with the initial state and value:

get_lfsr_lists

This predicate defines the call get_lfsr_lists/6. This is called from get_lfsr_values/5 and is used for the Linear Feedback Shift Registers. The arguments are:

1. width: width of the counter (in Bits),
2. tapslist: Prolog List denoting the feedback bits position in the counter,
3. skip: The length of the "skipped" states,
4. decode: The pattern before the skipping begins,
5. jump: The pattern at which skipping ends.
6. initial: The starting state and value The steps are:

1. First, build a list which is all zeros.
2. Then generate all of the lfsr states as a key-value pair where the key is the ordinal of the state and the value is the decimal equivalent of the vector representing that state. We stop when we have generated $2^n-1$ states.
3. The next step is to find the initial and final states for the skip distance that is specified. This is done by finding which states are the correct distance apart and differ in only their MSB.
4. Once we have the decimal values for the Jump and Decode, we need to convert them into lists to be returned by this call.

find_skip_states

The steps are:

1. To find the skip states we take the key-value list and step through it until we find a pair of states that meet the requirements. The requirements are that the values differ only in their MSB and the states are the value of skip apart. To do this we also consider the case where there is wrap-around.
2. If the other state and value are correct, then we find the state before the initial state since that is the state that must be decoded to skip the intervening states.
3. There are two cases that need to be differentiated. The correct value will either precede or follow the current state. Once we find the states, we terminate by passing an empty list as the first argument.
4. If the current state and other states are not the right ones, then we repeat this procedure down the list until the correct pair of states is found.

Taps for LFSR Counters

The bit positions for the XNOR feedback of different linear feedback shift registers are based on the width of the counter. The list of taps indicates the specific flip-flop bits that need to be fed back into the XNOR. The starting bit location is Bit 1. These values were taken from "Counter Examples" in The Programmable Gate Array Design Handbook, page 2–117, from the LSI Logic CMOS Macrocell Manual (July 1985), pages 18–48 to 18–56, incorporated by reference.

Logic

The logic modules generate functions of AND, OR, XOR, and INVERT on a bus, a bus and a scalar, or on two busses.

Transformations

The BLOX logic symbols are expanded into an array of XNF logic symbols.

Expanding Various Logic Symbols

A logic symbol and the nets that attach to it are expanded into an array of XNF logic symbols. The symbols and the behavior they represent are:

ANDBUS1—ANDing a signal with members of a bus
ANDBUS2—ANDing the elements of two busses
ANDBUS—ANDing all the elements of a bus together
ORBUS1—ORing a signal with members of a bus
ORBUS2—ORing the elements of two busses
ORBUS—ORing all the elements of a bus together
XORBUS1—XORing a signal with members of a bus
XORBUS2—XORing the elements of two busses
XORBUS—XORing all the elements of a bus together
3STATE—Tri-stating all of the elements of a bus
INVBUS—INVerting all the elements in a bus Find the types of both the I, and the O connections on the INVBUS symbol. To determine the basename of these connections and the left and right bounds of the busses. Determine the width of the I and O busses. Both should have the same width. If the two bus widths do not match, then issue an error and fail. Generate a list of the subscripts for the I and O busses.

To generate all the gate symbols required to expand the logic symbol, find all the solutions for the list of subscripts for the Output bus. To do so, 1. For each possible subscript for the Output bus,
2. Find a corresponding subscript for the Input bus, and
3. Find a corresponding output name from the Output bus, and
4. Find a corresponding input name from the Input bus, and then
5. Build the appropriate gate function.

Building Logic Gates with a Scalar and Bus Input

Find the types of both the Bus_Input, and the Bus_Output connections on the LOGICBUS1 symbol. Also determine the basename of these connections and the left and right bounds of the busses. Determine the width of the DATA and Q busses. Both should have the same width. If the two bus widths do not match, then issue an error and fail.

Generate a List of the Subscripts for the B and O Busses

To generate all the gate symbols required to expand the logic symbol, find all the solutions for the list of subscripts for the Bus_Output bus. To do so:

1. For each possible subscript for the Bus_Output bus,
2. Find a corresponding subscript for the B_Input bus, and
3. Find a corresponding output name from the Bus_Output bus, and
4. Find a corresponding input name from the B_Input bus, and then
5. Build the appropriate gate function.

Building Logic Gates with Two Bus Inputs

Find the types of the A_Input, B_Input, and the Bus_Output connections on the LOGICBUS2 symbol. Also determine the basename of these connections and the left and right bounds of the busses. Determine the width of the DATA and Q busses. Both should have the same width. If the two bus widths do not match, then issue an error and fail. To generate all the gate symbols required to expand the logic symbol, find all the solutions for the list of subscripts for the Bus_Output bus. To do so:

1. For each possible subscript for the Bus_Output bus,
2. Find a corresponding subscript for the A_Input bus, and
3. Find a corresponding subscript for the B_Input bus, and
4. Find a corresponding output name from the Bus_Output bus, and
5. Find a corresponding input name from the A_Input bus, and
6. Find a corresponding input name from the B_Input bus, and then
7. Build the appropriate gate function.

Logic Gate Functions of Members of A Bus

This function takes an incoming data bus and performs the specified function on each member of the bus. For example, the ANDBUS function would perform $A_0$ AND $A_1$ AND $A_2$...AND $A_n$ and AND all of the bus members together. This would produce a single output that is the product of all of the members of the bus.

Find the types of the A_Input and the Output connections on the LOGICBUS symbol. Also determine the basename of these connections and the left and right bounds of the busses. There may be a user-specified inversion mask for the gate. Each one (1) in the inversion mask indicates a bit that should be inverted. Ensure that the input bus is connected to ELEMENT symbols before it is expanded. Merge the returned graphs into a single graph that can be integrated into the global signal and symbol graphs.

Forcing a Value onto a Bus-FORCE

This function forces the specified value onto the bus attached to the output. The value is specified in VHDL-style syntax with a base, and a value, separated by number signs (#):

Value=Base#Value#

Input/Output Module Generators

This section describes the available input/output module generators.

Inputs

This section describes generation of XNF primitives from BLOX INPUTS primitives.

Transformation

Figure 6:
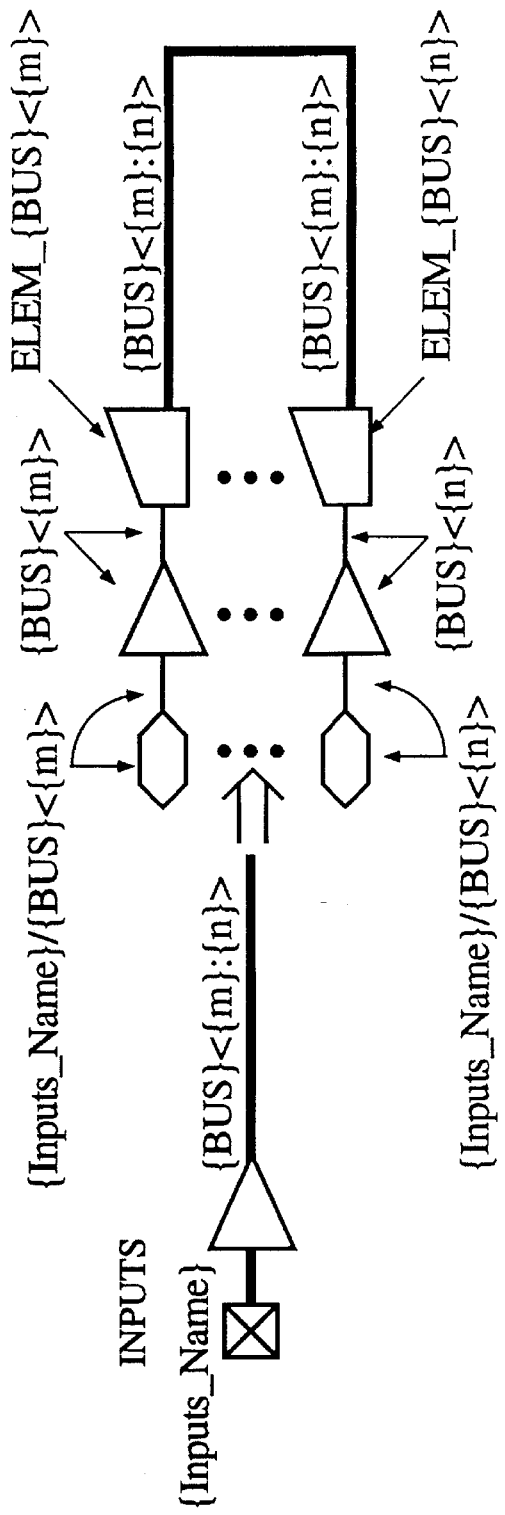
FIG. 6 shows the expansion scheme for the INPUTS symbol.

The steps are:
1. The symbol INPUTS is expanded into an array of input pads (EXTI) connected to an array of input buffers IBUF (as shown in FIG. 6). These input buffers are each connected to an array of bus ELEMENTs. These bus ELEMENTs connect to the bus to which the original INPUTS symbol was connected.
2. An array of signals is needed to connect the input pads to the input buffers. Another array of signals is needed to connect the input buffers to the ELEMENTs. This latter array of signals (or some of them) may already exist, and so care is taken not to re-create them if they already exist. Each row of the array of EXTI and IBUF symbols is created separately.

Outputs

Transformation

Figure 7:
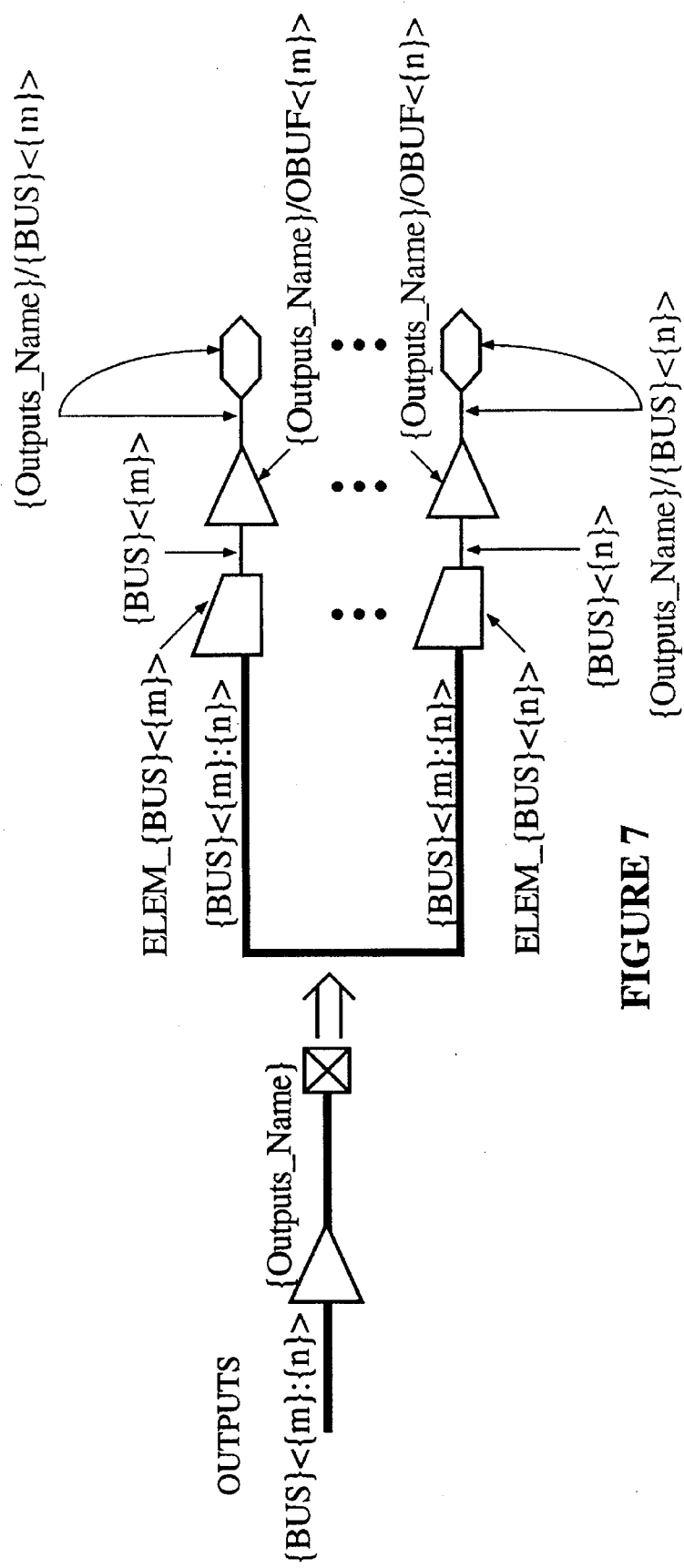
FIG. 7 shows the expansion scheme for the OUTPUTS symbol.

The symbol OUTPUTS is expanded into an array of output buffers (OBUF) connected to an array of output pads (EXTO). (As shown in the FIG. 7 OUTPUTS.) These output buffers are each connected to an array of bus ELEMENTs. These bus ELEMENTs connect to the bus to which the original OUTPUTS symbol was connected. An array of signals is needed to connect the output pads to the output buffers. Another array of signals is needed to connect the output buffers to the ELEMENTs. This latter array of signals (or some of them) may already exist, and so care is taken not to re-create them if they already exist.

Each row of the array of EXTO and OBUF symbols is created separately.

Bidirectional I/O

There are two forms of bidirectional I/O—BIDIR_IO and BUS_IO. Both use an external chip pin for input and output. The difference between the two is that BIDIR_IO is connected to an internal bidirectional bus.

Transformation

Figure 8:
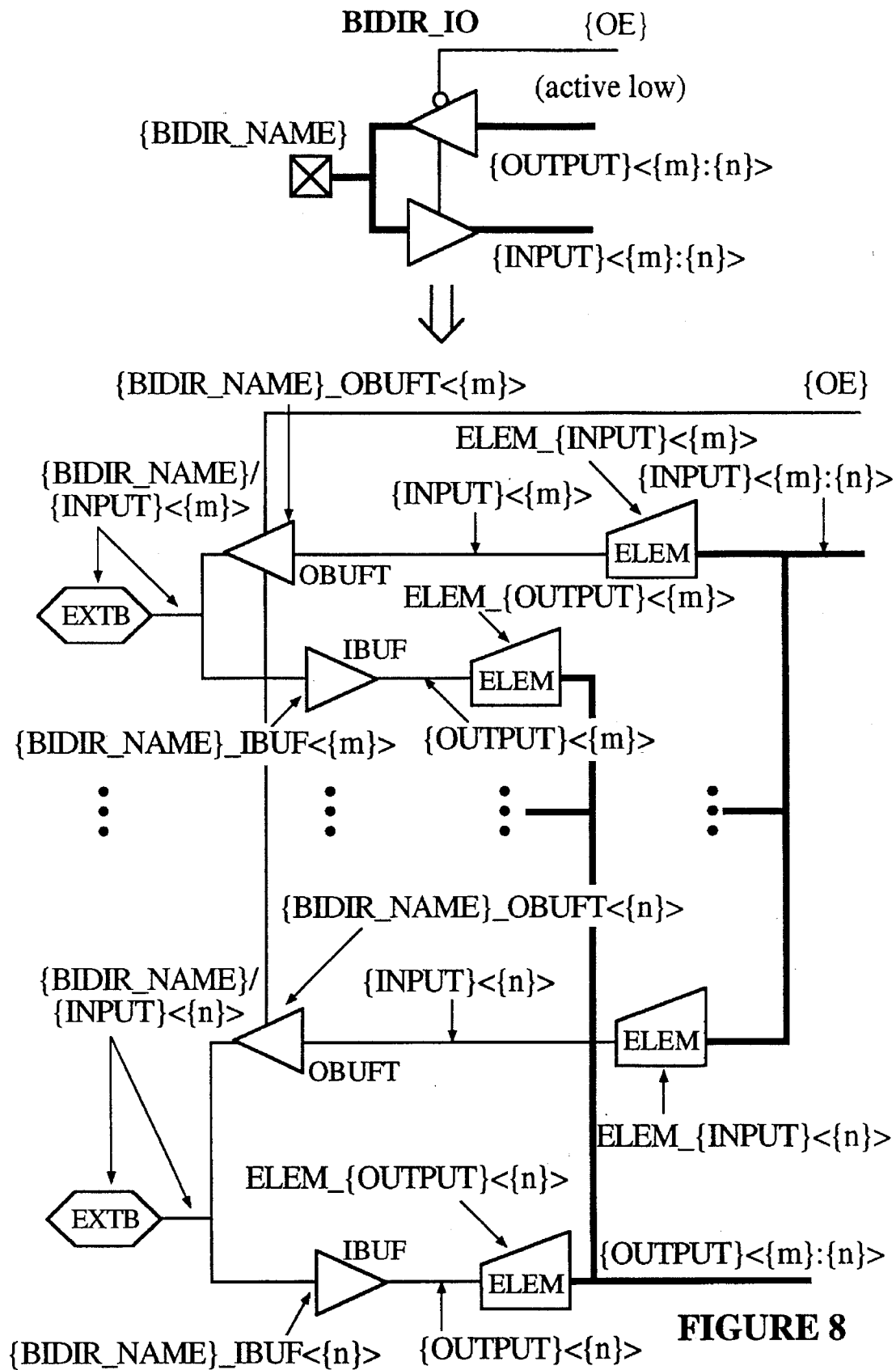
FIG. 8 shows the expansion scheme for the BIDIR-IO symbol.

The symbol BIDIR_IO is expanded into an array of I/O pads (EXTB) connected to an array of input buffers (IBUF) and tristate output buffers (OBUFT). (See FIG. 8). Each of these input and output buffers are connected to an array of bus ELEMENTs. These bus ELEMENTs connect each element of the input and output buses to the buses to which the original BIDIR_IO symbol was connected. The OE signal is connected to all the pins of the OBUFT symbols. In a variation of the BIDR_IO symbol of FIG. 8, there is an additional TBUF symbol inserted between each IBUF and the associated ELEM symbol, and the enable pins of the TBUF symbols are all connected to a single additional input called IE to the BIDR_IO symbol.

Each row of the array of EXTB and IBUF symbols is created separately.

Bidirectional Buses

Transformation

Figure 9:
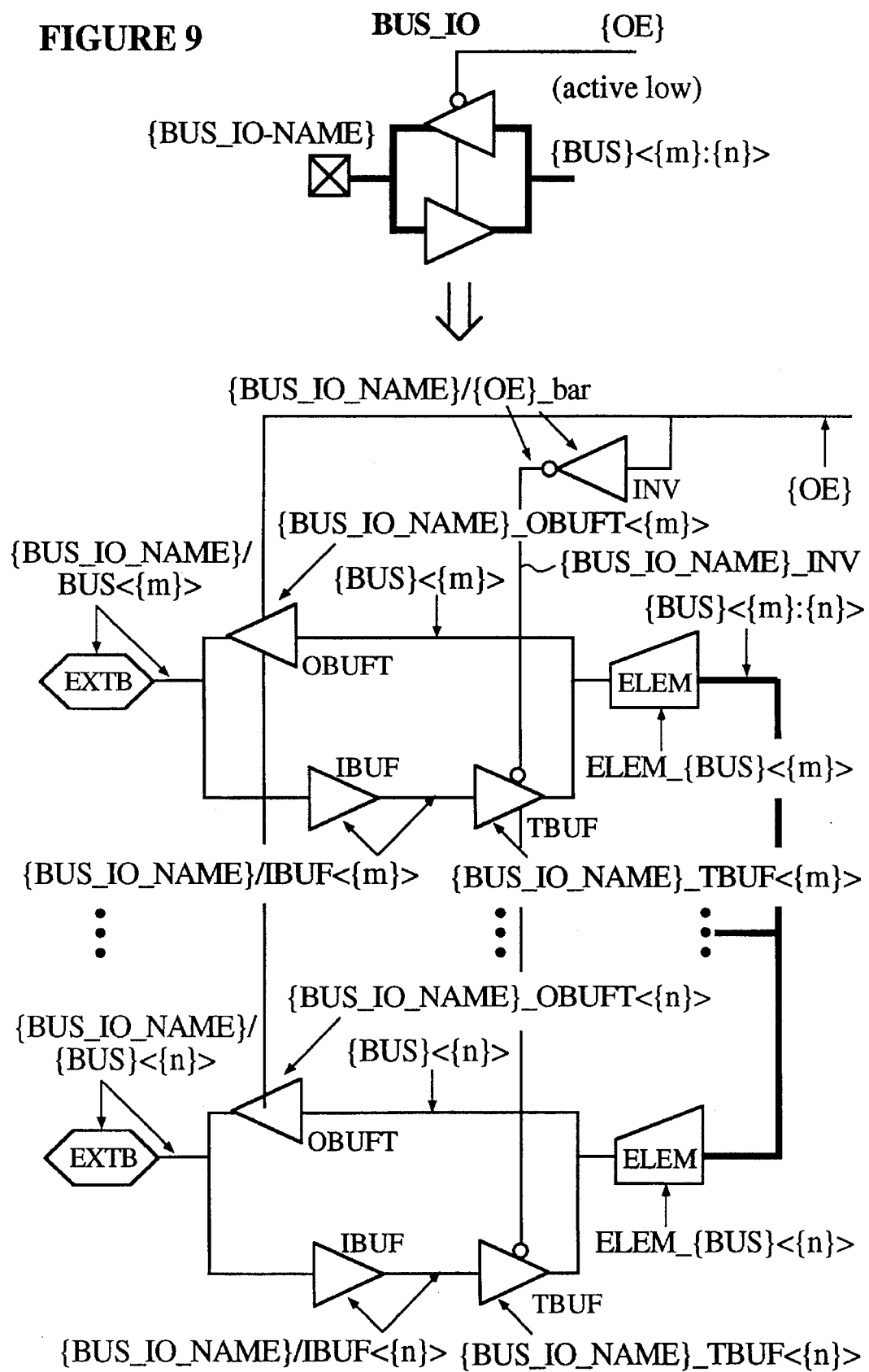
FIG. 9 shows the expansion scheme for the BUS-IO symbol.

The symbol BUS IO is expanded into an array of I/O pads (EXTB) connected to an array of input buffers (IBUF) and tristate output buffers (OBUFT). The two internal buses are not connected as they are in the BIDIR_IO symbol. The IBUFs connect to tristate buffers (TBUF). (As shown in FIG. 9.) These tristate buffers are each connected to an array of bus ELEMENTs. These bus ELEMENTs connect to the bus to which the original BUS_IO symbol was connected. Each row of the array of EXTB and IBUF symbols is created separately.

Data Type Module Generators

This section contains the specifications of the data type module generators.

Comparators

Figure 10:
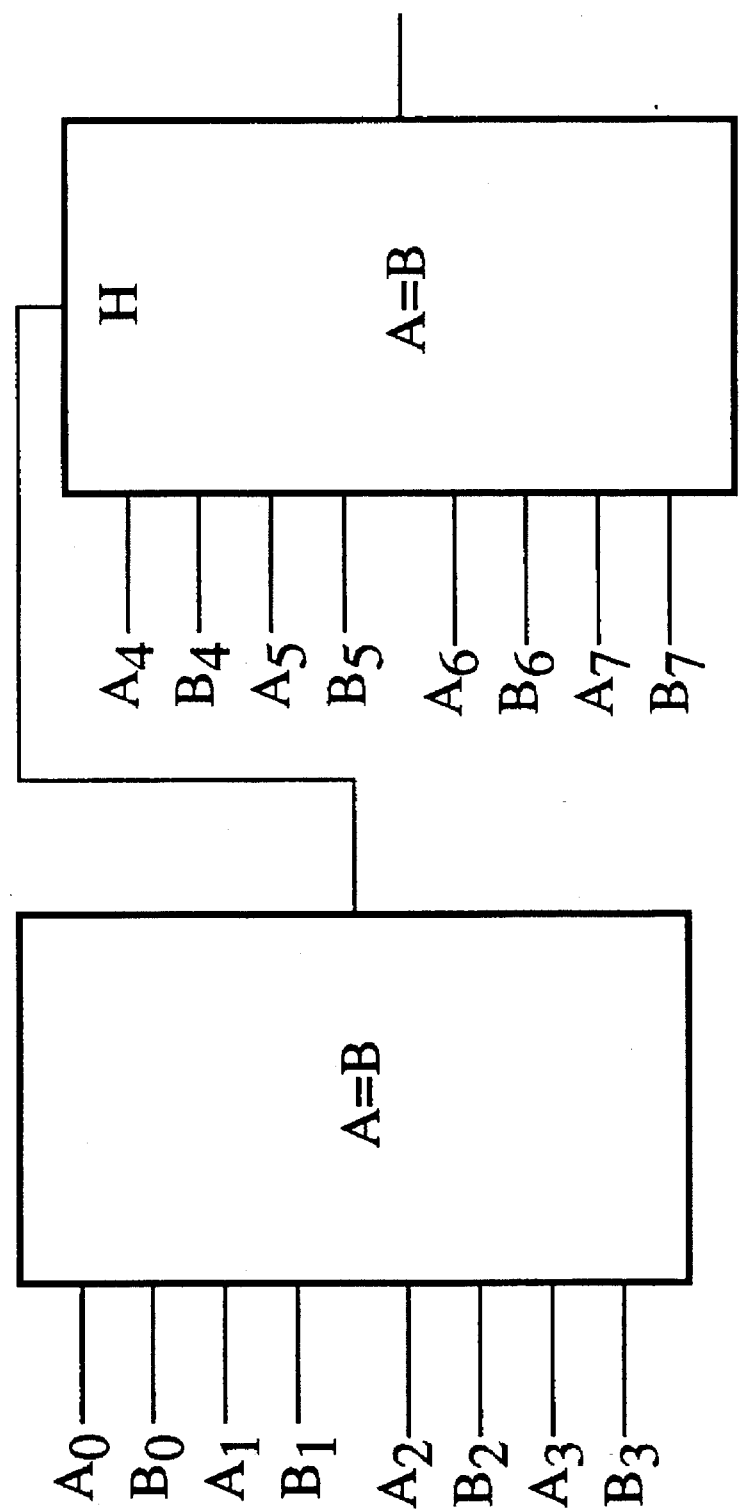
FIG. 10 shows a ripple-logic comparator.
Figure 11:
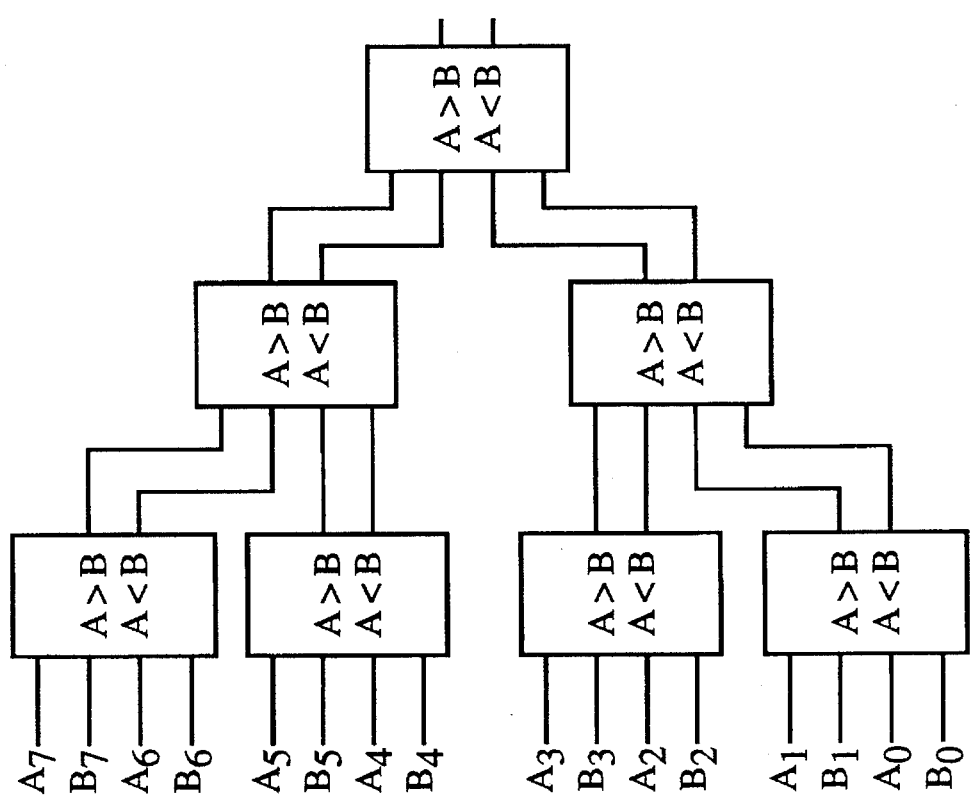
FIG. 11 shows a tree-logic comparator.
Figure 12:
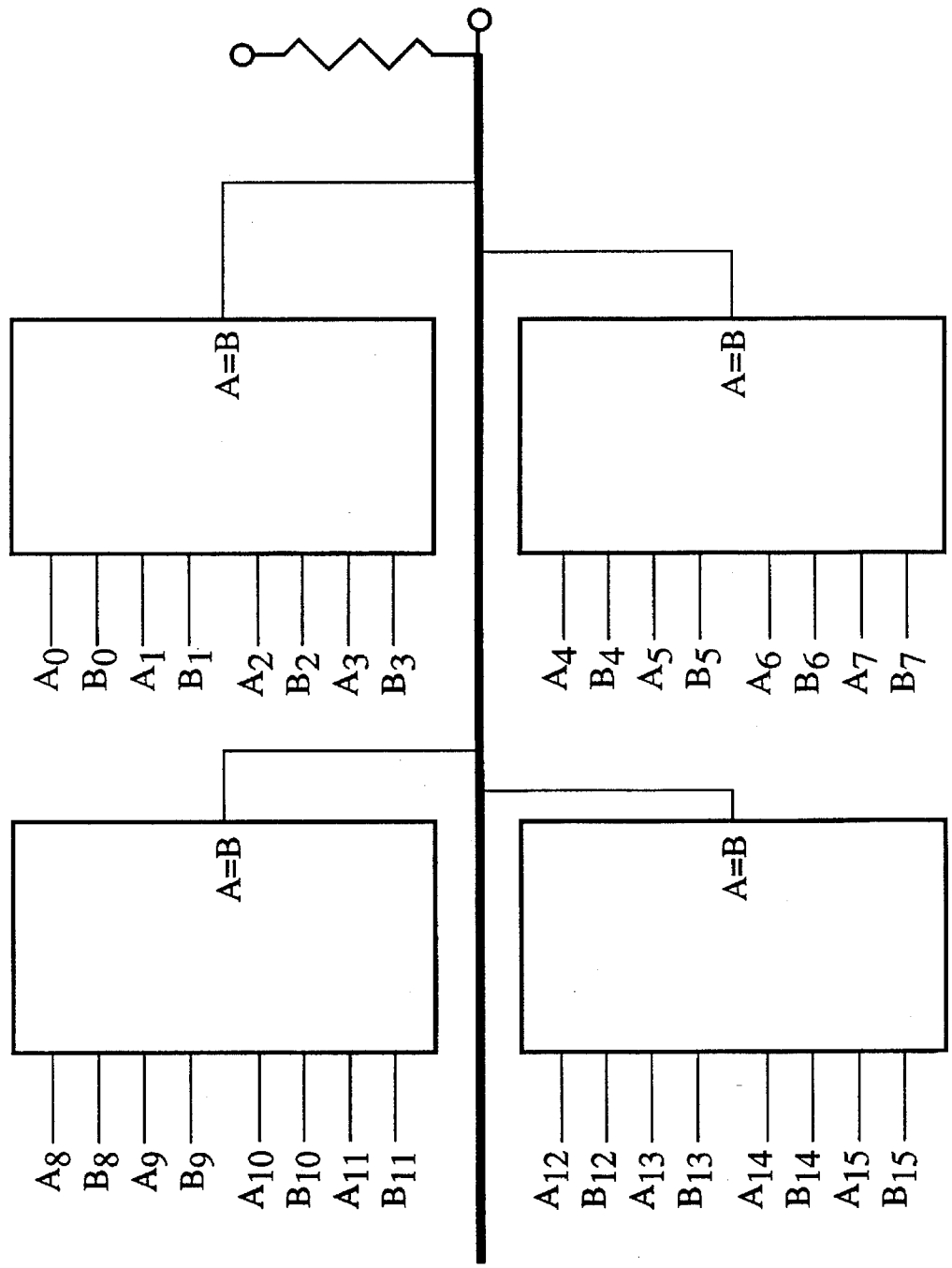
FIG. 12 shows a wired-logic comparator.

The four versions of the comparator described here include a tree-logic model, a ripple-logic model, a wired-logic model, and an arithmetic model. The first logic model (called tree-logic) uses a tree of CLBs taking the input bits two at a time from each input to derive the input to the next stage (see FIG. 11 for tree-logic). The second logic model (called ripple-logic) consumes four bits from each input with each stage (see FIG. 10 for ripple-logic), but is only useful for finding equality. The third model is also only good for checking for equality, but is very fast, using a horizontal Long Line to do a wired-and of an array of CLBs (see FIG. 12 for wired-logic). Each CLB consumes four bits from each input. Because the Xilinx 4000 IPGA has built-in fast carry logic, one may use an arithmetic comparator using an adder to generate the difference of the two inputs, and logic to determine the result of the comparison. This would consume two bits with each stage and would have the advantage of the built-in carry-look ahead circuitry's speed, but requires a hard-macro adder.

When using the arithmetic comparator, if the difference is found by subtracting one value from the other, a negative sign bit indicates that the minuend was less than the subtrahend. This provides the<result. If, instead of subtracting one value from the other, a bitwise complement is done (one's complement) and that value is added to the other value, then the>result can be found. However, in order to determine if the two inputs are equal both of these methods would have to be used, either serially or simultaneously in two arithmetic units, and the two results combined to determine equality.

The result is four very different implementations, each with strengths and weaknesses in the number of CLBs used (Area), the number of CLBs in the critical path (Delay), and the number of routes required (Routability). Note that the number of CLBs used is an estimate based on expected utilization. The logic that is produced should assist the mapper to build the comparator in an efficient way. The selection of the correct implementation will vary depending upon all of the constraints of the design, which would include the variety of the available results from the comparator. The tree-logic comparator gives two results (> and <), the ripple-logic comparator and wired-logic comparators give only equality, and the arithmetic comparator gives either> or <, but not equality.

Table 3 shows how the designs compare when the inputs are 16-bit values for one of the logic pairs, and all three of the logic pairs. Table 4 shows the results when the inputs are 32-bit values. If we want to know if two relatively short input values are equal then the ripple-logic comparator would be a better choice. For the Xilinx 4000 family, the tree-logic version is overshadowed by the speed of the arithmetic version and the size of the ripple-logic version, however, since the arithmetic version is implemented in a hard macro, there may be times when more flexible placement and routing is needed, while keeping the delay minimal.

TABLE 3

| RESULTS DELAY ROUTES | SINGLE RESULT AREA DELAY ROUTES | | | ALL AREA | | |
|---|---|---|---|---|---|---|
| | (CLBs) | (CLBs) | (Lines) | (CLBs) | (CLBs) | (Lines) |
| tree-logic | 15 | 4 | 28 | 15.5 | 4 | 30 |
| ripple-logic | 4 | 4 | 3 | with arithmetic | | |
| wired-logic | 4 | 1 | 4 + LL | with arithmetic | | |
| arithmetic | 9 | 1 | 0 | with another comparator | | |

TABLE 4

| RESULTS DELAY ROUTES | SINGLE RESULT AREA DELAY ROUTES | | | ALL AREA | | |
|---|---|---|---|---|---|---|
| | (CLBs) | (CLBs) | (Lines) | (CLBs) | (CLBs) | (Lines) |
| tree-logic | 31 | 5 | 60 | 31.5 | 5 | 62 |
| ripple-logic | 8 | 8 | 7 | with arithmetic | | |
| wired-logic | 8 | 1 | 8 + LL | with arithmetic | | |
| arithmetic | 17 | 2 | 0 | with another comparator | | |

For those cases where more than one result is required, the ripple-logic and wired logic comparators complement the arithmetic comparator, and an extra half of a CLB is used to determine the desired results of the comparison. All three of the results are available from the tree-logic comparator by using a two-input and-gate for equality. The arithmetic comparator can be used with a second arithmetic comparator or either of the two equality comparators (ripple-logic or wired-logic).

Resolving Dependencies

The ripple-logic comparator provides a resource efficient, easily-routable, but slightly slower version of equality comparison. Where the delay of the tree-logic comparator goes up as the $\log_2$ of the number of inputs, the delay of the ripple-logic comparator goes up one CLB delay for every four inputs. Thus, the ripple-logic comparator is best used for checking equality of signals not more than 20 bits wide.

The wired-logic comparator provides an extremely fast equality check. It requires only N/4 CLBs, and takes one CLB delay to form the result. However, a horizontal Long Line is used to make the wired-and, and for best results, all of the CLBs used to make the wired-logic comparator should be in either the row adjacent to the Long Line, or the second row from the Long Line. For short inputs, this is wasteful of routing resources, and unnecessarily constrains the placement of CLBs.

The basic arithmetic comparator provides a single complementary pair of results in the form of the sign of the result from subtracting one of the values from the other. The compare is done by subtracting the subtrahend from the minuend and checking the sign-bit if the values are two's complement, or checking the carry out if the values were unsigned. In the case of two's complement values, if the sign-bit is zero, then the minuend is greater than or equal to the subtrahend, otherwise, the subtrahend is greater than the minuend.

To obtain the full set of comparison results, it is possible to do a second compare in the same arithmetic unit. If a standard two's complement subtract is done the first time, then adding the one's complement should be done the second time. If the initial result is that A≧B, then the second compare can be done by taking the one's complement of the subtrahend and adding that to the minuend. If this second compare yields A≦B, then the operands were equal.

The carry out acts like a two's complement sign bit when working with unsigned values. Because both unsigned numbers are positive by definition, the result signaled by the carry out bit will be equivalent to the result signaled by the sign bit when dealing with two's complement numbers. When working with values in sign-magnitude representation, very fast results can be obtained if the signs are different since the positive number will always be strictly greater than a negative number. If the sign bits are the same, any of the comparators discussed so far can be used to do the comparison of the magnitude portion of the values and evaluating the result in light of the common sign-bit of the two values. If both were positive, then the carry out is the same as two unsigned numbers. If both were negative, then the result should be inverted.

BLOX Compare

Since the exact results for the three designs are not known, the following criteria are used:

1. When a check for equality (only) is desired and the inputs are narrower than 20 bits, the ripple-logic comparator will be used.
2. When a check for equality (only) is desired and the inputs are wider than 20-bits, the wired-logic comparator will be used.
3. When the test is for either <or> and the inputs are wider than 20 bits, the arith-logic comparator will be used.
4. When the test is for either <or> and the inputs are narrower than 20 bits, the tree-logic comparator will be used.
5. When the test is for more than one comparison result and the inputs are narrower than 20 bits, the tree-logic comparator will be used.
6. When the test is for more than one comparison result and the inputs are wider than 20 bits, an arithmetic comparator along with a wired-logic comparator will be used (called arithwired).

A COMPARE module is expanded by first checking the outputs to see which of the complementary pairs of outputs are necessary, then the inputs are analyzed to see how wide the input buses are. With that information, the type of COMPARE to be used can be determined. The two input buses are compared to be sure they are of the same type and the same width. Based on the criteria set forth earlier, the proper type of comparator is determined. The comparator is constructed.

Finding the Required Types

There are six outputs, but they are divided into three possible types of compare. The list of 6 outputs is reduced to a list containing the required comparisons. These lists will contain from one to three of the atoms: eq, lt, gt.

The Tree Comparator

The tree comparator is described in detail above and is built of a tree of 2-bit comparators. There are two basic cases, either the number of bits in each bus input is even or odd. Because the bits are consumed two at a time, the terminating case will be an empty set if the number is even, or a single signal if the number is odd. More fundamentally, if the buses are one bit wide (an edge case) then the input signals are also the output signals. In all other cases, the outputs will be the outputs of the CLB tree.

Building the rest of the tree involves combining the first level two at a time, and each time appending the new module onto the back of the list of units to be combined. When there is only one unit left, it is done. There is one special case. If both of the inputs are single bits, then there is no unit to combine. Otherwise, there may be two left over signals to combine in the second level, or there may be only a single unit, or there may be multiple units. The logic gates used for building each node in the tree are the same for every node. The gates get their names from the A inputs in the first level of the logic and from the B inputs in the second level of the logic. The outputs take their name from the first level 'AND' gates with "_OUT" added to the signal name.

The Ripple Comparator

The ripple comparator is described in detail above and is built of a string of CLB-based 4-bit comparators. Because the bits are consumed four at a time, the terminating case will be a set of four or fewer inputs. To find all of the signals associated with each of the buses, bus_signals is used. The ripple logic takes four bits from each of the two inputs. Each of these blocks of logic should fit in a single CLB. This transformation passes an empty list to create_logic_ripple that will hold the list of outputs from the logic comparators used for the excess bits. They are ANDed together with the output of the chain of CLBs.

If there are no extra signals, and there were no extra signals to start with, then the output is the same as the input. This is the case when the width of the input buses was divisible by four. When the input bus width was not divisible by four, we create extra comparators, and AND their outputs together along with the output of the last ripple block. Following is the terminating case where there are no more extra signals, but there were extra inputs that have created compare outputs that need to be ANDed together. The other case is where there are still extra signals that need to be compared and put into the list of OutsSoFar. This continues until the previous case is encountered.

The Wired Comparator

The wired comparator is described in detail above and is similar to the ripple comparator. The difference is that instead of rippling the result of each of the four-bit compares, all of the CLB comparators are ANDed together at once using a WIRED AND. The first clause adds an accumulator for the outputs. The build_rest_of_wired function has to do two things. The first is to build the comparators required for the extra inputs that can't be mapped into the regular CLB-like structure. The second is to put a WAND onto each of the outputs, then add a PULLUP to complete the WIRED-AND. This first part builds the extra comparators and adds them together. There are zero, one, two, or three extra inputs. Once all the outputs have had a WAND attached, the pullup must be attached. For each of the outputs in the list, a WAND is attached.

The Arith Comparator

The arith comparator is described in detail above and uses a hard-macro ARITH to perform a subtraction. The carry-out will thus represent the fact that the B input was larger than the A input (B>A). This initial version will only provide A_LT_B and A_GE_B.

The Arithripple Comparator

The arithripple comparator is described in detail above and is actually two comparators that provide enough information to determine any of the desired output values. The arith portion provides A_LT_B and the ripple portion provides A_EQ_B, from which any of the other four output values can be determined using only AND gates and INV gates.

Multiplexers

Construction Details

When building multiplexers, for instance, in a Xilinx 4000 EPGA there are two alternate constructs. When to use one construct over another depends on the speed, area, and routability of the circuit.

Logic Multiplexers

Logic multiplexers are built from the logic function within a CLB. They are best for smaller multiplexers, i.e., eight or fewer inputs. They are best for multiplexers with binary mapping between the select signals and the data inputs.

Generic Multiplexer-MUXBUS

This function is a generic multiplexer that accepts an arbitrarily wide input bus and multiplexes the signals down to a single output. The number of select lines must be sufficient to address the width of the input bus for the given representation.

Two-Input Bus Multiplexer-MUXBUS2

This function multiplexes two bus-wide input together to produce a new, bus-wide output. The steps are:
1. First, check the width of the output signal from the multiplexer. All of the input signals should have the same width as the output. If the output from the multiplexer is not a bus, then it is single bit. The left and right bounds are needed for the output for the findall to work correctly. For the single-bit case, the left and right bounds are set to zero.
2. Next, check the A input. If it is left unconnected, then assume that the input is attached to an array of ground (GND) signals. The array is the same width as the width of the output. Again, the single-bit case is handled.
3. Next, check the B input. If it is left unconnected, then assume that the input is attached to an array of ground (GND) signals. The array is the same width as the width of the output. Again, the single-bit case is handled.
4. Next, check the SEL input. This input needs to be connected. For the MUXBUS2 symbol, the SEL input can be either a single-bit or a bus with a single element.
5. Currently, only the BINARY encoding is supported for multiplexers. The number of select bits needs to support the number of possible selections. In this case, one input is required to select between two inputs (input A and input B).
6. For each output from the MUXBUS2 symbol, build a 2-to-1 multiplexer function.

Four-Input Bus Multiplexer-MUXBUS4

This function multiplexes four bus-wide inputs together to produce a new, bus-wide output. The steps are:
1. First, check the width of the output signal from the multiplexer. All of the input signals should have the same width as the output. If the output from the multiplexer is not a bus, then it is single bit. The left and right bounds are needed for the output for the findall to work correctly. For the single-bit case, the left and right bounds are set to zero.
2. The inputs A, B, C, and D are processed as follows. If the input is left unconnected, then the inputs are connected to an array of ground (GND) signals. The array is the same width as the width of the output. The single-bit case is handled.
3. Next, check the SEL input. It must be connected and be a bus array of three signals.

Eight-Input Bus Multiplexer-MUXBUS8

This function multiplexes eight bus-wide inputs together to produce a new, bus-wide output. The steps are:
1. First, check the width of the output signal from the multiplexer. All of the input signals should have the same width as the output. If the output from the multiplexer is not a bus, then it is single bit. The left and right bounds are needed for the output for the findall to work correctly. For the single-bit case, the left and right bounds are set to zero.
2. The inputs A, B, C, D, E, F, G and H are processed as follows. If the input is left unconnected, then the inputs are connected to an array of ground (GND) signals. The array is the same width as the width of the output. The single-bit case is handled.
3. Next, check the SEL input. It must be connected and be a bus array of three signals.

Three-State Multiplexers

Three-state multiplexers are built primarily from TBUFs and may include CLB logic used to select TBUF enable signals. They are best used for one-shot mapping between the select signals and the data inputs. They can be used for binary mapping but an extra selector is required to convert the binary code to a one-shot encoding. Because the TBUFs are located only on horizontal longlines, they represent a fairly significant placement constraint when used as multiplexers.

Creating a 2-to-1 Multiplexer

The steps are:
1. Check to see if any input is left unconnected. If so, tie the unused input to GND.
2. Create the names for the AND and OR gates in the multiplexer.
3. If the Output is specified, then generate a proper name for Output.

4. Determine the data types for the other input signals.
5. Assert the new gates and their associated signals.
6. Create the symbol graph for the multiplexer.

Buffers

Buffers are implemented by expanding the buffer into an array based on the width of the input buses.

Decoders

This function is similar to the well-known 74-138-type 3-of-8 decoder. The signals on the INPUT pins, along with the ENABLE, create a decoder array to select one of the possible outputs. The number of possible outputs is determined by the width of the INPUT bus and the value of the MAPPING parameter.

Buses

This section describes generation of XNF primitives from BLOX for buses.

Transformation

The ELEMENT symbol is not expanded, so no work needs to be done. The elements of the bus already exist, so it need not be created. The ELEMENT symbol will be removed automatically after modgen has completed. (This symbol cannot be removed before module generation is completed, as the bus may appear not to be connected to anything.)

Sequential Logic Module Generators

This section describes the sequential logic module generators.

Clock Dividers

The clock divider has four inputs, ENABLE, asynch_ctrl, synch_ctrl and CLOCK, and one output, DIVIDER. It also includes four parameters, DIVIDE_BY, DUTY_CYCLE, asynch_val, and synch_val. In order to implement the clock divider the following must be true:
1. The DIVIDE_BY value must be greater than the DUTY_CYCLE value,
2. a single register will be used to generate the clock_divide output, if necessary,
3. if no DUTY_CYCLE value is given, or if it is zero (0), then a DUTY_CYCLE of one will be used,
4. where the duty cycle is greater than one, two counters will be used where the first counter will count to the difference between the DIVIDE_BY value and the DUTY_CYCLE value, and the second counter will count to the DUTY_CYCLE value,
5. the next state will be the XNOR of the current state, and the terminal counts of the two counters,
6. the clock enable for the counters will be the current state for the first counter and the inverse of the current state for the second counter.

The first thing that needs to be true is that the values for the two parameters DIVIDE_BY and DUTY_CYCLE must be correct. If DIVIDE_BY is not given, then it is an error, and blox will halt after MODGEN has finished. If DUTY_CYCLE is not given, a value of one is used as the default. There are four different cases that need to be treated differently. The four cases are:

1. the DIVIDE_BY value is 2 and the DUTY_CYCLE value is 1
2. the DIVIDE_BY value is N>2 and the DUTY_CYCLE value is 1
3. the DIVIDE_BY value is N>2 and the DUTY_CYCLE value is N–1
4. the DIVIDE_BY value is N>2 and the DUTY_CYCLE value is neither 1 nor N–1

For the first case a single D-flip-flop can be used with the output inverted and fed to the input. For the second case a single Linear Feedback Shift Register (LFSR) counter can be used. The third case also requires only a single LFSR counter, but the output is inverted. For the final case, two LFSR counters must be used. The following section examines the DIVIDE_BY and DUTY_CYCLE values and makes the proper call to build the appropriate clock divider.

2CLOCK

The simplest clock divider is the divide by two which is implemented using a single D-flip-flop. In addition, an inverter is used in the feedback path from the DIVIDE output to the D input of the flip-flop.

LFSR

The two steps are:
1. Two of the clock dividers are roughly equivalent. They each use a single LFSR counter, but one uses the inverse of the output for the appropriate duty cycle. A dummy output bus for the counter needs to be provided for proper operation of the counter.
2. The following predicate finds the values for DIVIDE_BY and DUTY_CYCLE. If DIVIDE_BY is not given, then it is an error, and blox will halt after MODGEN has finished. If DUTY_CYCLE is not given, a value of one is used as the default.
3. First NVal (the number to divide by) is determined. The value for this parameter must be a number and must be at least 2. Otherwise, it is an error, and a value of zero is assigned to NVal and DVal (the duty cycle).
4. The value assigned to the duty cycle is determined from the parameters. It must be a number that is at least one, and strictly less than NVal. If no value is given for the duty cycle, it is set to 1.
5. Selecting the divider type is straight forward.

Utilities

This section describes utility functions that aid in module generation.

Bus Utilities ensure bus expanded ensure_bus_expanded expands the bus and checks that each separate signal has been created and returns a list of the expanded signal names and a list of the ELEMENTS symbols that connect to these signals. The data base stores separate names for the signals and symbols.

ensure_elements_connected

This function takes a list of signals in a bus and returns the symbol and signal graphs that describe the connectivity of the bus signals to bus ELEMENT symbols. If these ELEMENT do not exist, they will be created. Each ELEMENT symbol is made up of the characters ELEM prepended to the name of the signal.

expanded bus names expanded_bus_names/4 takes a string representing the basename of a signal name, a data type (or its name), and returns a list of names corresponding to each of the signals which would be part of the main bus, and a list of the bus indices.

Primitive (scalar) data types do not need to be expanded.

ensure_signals_created/3

The steps are:
1. ensure_signals_created/3 takes a list of signal names, their data type, and the list of source lines where the signal is used. This predicate will assert the proper facts into the data base for each of these signals if they do not already exist.
2. The data types don't match. A signal with the same name has already been asserted, but may not be what we want. Check to see if the data type has been unified yet.
3. The signal hasn't been asserted yet.

find_types_for_signals/2 find_types_for_signals/2 takes a list of the signals and returns a list of equivalent size containing the type for each signal. If there are valid signals, then append the new type to the type list and recourse through the signal list.

Checking Symbols with check_symbol

This function accepts an atom containing the name of a symbol instance and checks the symbol against the known rules to see if there are any errors. It works for symbols with or without Styles.

Determining connections with make_connection_list/2

This function accepts an input list, List, containing signals that attach to some symbol. The function then determines whether each of those connections attaches to a valid signal, to power, to ground, or is unconnected. It returns a list, which is the same size as List, that contains the connection type for each signal.

This disclosure is illustrative and not limiting; further modifications will be apparent to one skilled in the art. Also, this disclosure includes copyrightable material. Permission is granted for facsimile reproduction of this material, but all other copyright rights are reserved.

We claim:

1. A method of designing a digital circuit comprising the steps of:
   capturing a digital circuit design as a plurality of high level arithmetic and logical functions;
   providing a library of arithmetic and logical components corresponding to the plurality of high level arithmetic and logical functions, wherein the arithmetic and logical components are adaptable to a plurality of data types and precisions, wherein said data types include encoding information;
   assigning a component from the library to each function;
   inputting a user-selected data type and precision in the digital circuit;
   propagating the selected data type and precision through the digital circuit; and
   adapting at least one component as a result of the step of propagating.

2. The method of claim 1, further comprising a step of including components that are not altered in the step of adapting.

3. The method of claim 1, further comprising step, before the step of propagating, of converting the captured design to a net list.

4. The method of claim 1, further including a step of:
   optimizing a digital design for an architecture.

5. The method of claim 4, wherein the step of optimizing includes assigning a portion of the digital design to a section of a field programmable gate array.

6. The method of claim 4, further including a step of expanding the plurality of high level arithmetic and logical functions to their full width.

7. The method of claim 6, wherein the step of expanding uses a hard macro

8. The method of claim 4, wherein the step of optimizing includes allocating clock signals to primary buffers.

9. The method of claim 4, wherein the step of optimizing includes allocating set/reset signals.

10. The method of claim 4, wherein the step of optimizing includes allocating registers.

11. The method of claim 1, wherein the step of adapting comprises the steps of:
    expressing a plurality of input buffer and output buffer pairs with one symbol; and
    expanding the one symbol into at least one or more input buffer and output buffer pairs.

12. The method of claim 1, wherein the step of adapting includes the steps of:
    providing a circuit module which is a tree comparator; and
    selecting internal elements for the tree comparator which makes at least two bit comparisons simultaneously and which is organized hierarchically.

13. The method of claim 1, wherein the step of adapting includes the steps of:
    providing a circuit module which is a wired-and comparator; and
    selecting internal elements for the wired-and comparator in which a plurality of compare elements are logically connected by AND functions.

14. The method of claim 1, wherein the step of adapting includes the step of specifying all input lines to the digital circuit with one symbol.

15. The method of claim 1, wherein the step of adapting includes the step of specifying a group of output buffers and output pads from the digital circuit with one symbol.

16. The method of claim 1, wherein the step of adapting includes the steps of:
    expressing a plurality of bidirectional buffers and input/output pads with one symbol; and
    expanding the one symbol to one or more single bidirectional buffers and input/output pads.

* * * * *

UNITED STATES PATENT AND TRADEMARK OFFICE
CERTIFICATE OF CORRECTION

PATENT NO. : 5,499,192

DATED : March 12, 1996

INVENTOR(S) : Steven K. Knapp, Jorge P. Seidel and Steven H. Kelem

It is certified that error appears in the above-identified patent and that said Letters Patent is hereby corrected as shown below:

under "References Cited" insert the following:

--4,922,432  5/90  Kobayashi et al.  364/490--

Col. 1, line 24, delete "DEVICE." and insert --DEVICE,--.

Col. 3, line 65, delete "Now" and insert --now--.

Col. 14, line 36, delete "is" and insert --it--.

Col. 14, line 48, delete "ADD SUB" and insert --ADD_SUB--.

Col. 15, line 32, delete "depend" and insert --dependent--.

Col. 18, line 51, delete "XC 4000" and insert --XC4000--.

Col. 18, line 66, delete "can not" and insert --cannot--.

Col. 20, line 28, delete "than" and insert --then--.

Col. 24, line 58, delete "buses" and insert --busses-- (both occurrences).

Col. 25, line 1, delete "Buses" and insert --Busses--.

Col. 25, line 5, delete "BUS IO" and insert --BUS_IO--.

Col. 25, line 7, delete "buses" and insert --busses--.

UNITED STATES PATENT AND TRADEMARK OFFICE
CERTIFICATE OF CORRECTION

PATENT NO. : 5,499,192

DATED : March 12, 1996

INVENTOR(S) : Steven K. Knapp, Jorge P. Seidel and Steven H. Kelem

It is certified that error appears in the above-identified patent and that said Letters Patent is hereby corrected as shown below:

Col. 27, line 58, delete "buses" and insert --busses--.

Col. 27, line 60, delete "buses" and insert --busses--.

Col. 28, line 12, delete "buses" and insert --busses--.

Col. 28, line 34, delete "buses" and insert --busses--.

Col. 28, line 43, delete "buses" and insert --busses--.

Col. 31, line 8, delete "buses" and insert --busses--.

Col. 31, line 18, delete "Buses" and insert --Busses--.

Col. 31, line 21, delete "buses" and insert --busses--.

Col. 32, line 67, after "MENT" insert --symbols--.

Col. 33, line 1, delete "ELEM prepended" and insert --ELEM_prepended--.

Col. 34, line 11, after "comprising" insert --a--.

Col. 34, line 18, delete "afield" and insert --a field--.

UNITED STATES PATENT AND TRADEMARK OFFICE
CERTIFICATE OF CORRECTION

PATENT NO. : 5,499,192

DATED : March 12, 1996

INVENTOR(S) : Steven K. Knapp, Jorge P. Seidel and Steven H. Kelem

It is certified that error appears in the above-indentified patent and that said Letters Patent is hereby corrected as shown below:

Col. 34, line 23, after "macro" insert a period (.).

Signed and Sealed this

Seventh Day of October, 1997

Attest:

BRUCE LEHMAN

Attesting Officer

Commissioner of Patents and Trademarks